(12) United States Patent
Otake et al.

(10) Patent No.: US 6,983,413 B2
(45) Date of Patent: Jan. 3, 2006

(54) DATA PROCESSING METHOD USING ERROR-CORRECTING CODE AND AN APPARATUS USING THE SAME METHOD

(75) Inventors: Koichi Otake, Tokyo (JP); Yoshiyuki Ishizawa, Yokohama (JP); Tadashi Kojima, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 867 days.

(21) Appl. No.: 09/813,782

(22) Filed: Mar. 22, 2001

(65) Prior Publication Data

US 2002/0073376 A1   Jun. 13, 2002

(30) Foreign Application Priority Data

Dec. 12, 2000 (JP) ............................. 2000-377838
Dec. 28, 2000 (JP) ............................. 2000-401172

(51) Int. Cl.
  *G11C 29/00* (2006.01)
  *G11B 7/00* (2006.01)
(52) U.S. Cl. .................. 714/764; 714/710; 369/53.35
(58) Field of Classification Search ................ 714/702,
  714/746, 752, 755, 758, 763, 766, 800, 52,
  714/774, 799, 710, 711; 711/127, 157, 173;
  369/275.3, 53.1, 53.31, 53.35; 365/200,
  365/201
See application file for complete search history.

(56) References Cited

U.S. PATENT DOCUMENTS

| | | | | |
|---|---|---|---|---|
| 5,247,523 A | * | 9/1993 | Arai et al. | .................... 714/755 |
| 5,623,459 A | * | 4/1997 | Iwamura et al. | ............ 369/126 |
| 6,311,304 B1 | * | 10/2001 | Kwon | ......................... 714/755 |
| 6,718,506 B1 | * | 4/2004 | Sebastian et al. | ............ 714/763 |

FOREIGN PATENT DOCUMENTS

| | | |
|---|---|---|
| CN | 1150859 | 5/1997 |
| CN | 1233053 | 10/1999 |
| JP | 60-176136 | 9/1985 |
| JP | 3-232039 | 10/1991 |
| JP | 4-205133 | 7/1992 |
| JP | 4-321978 | 11/1992 |
| JP | 6-73111 | 9/1994 |
| JP | 11-3290 | 1/1999 |

* cited by examiner

*Primary Examiner*—Christine T. Tu
(74) *Attorney, Agent, or Firm*—Oblon, Spivak, McClelland, Maier & Neustadt, P.C.

(57) ABSTRACT

When an error-correcting code is created for the data stored in a memory and added to the data, even if an error occurs in the data on the memory, the adverse effect of the error will be eliminated. In the present invention, when the data is stored in the memory, an error-correcting code PI is created beforehand using another memory, such as an S-RAM. The error-correcting code PI, together with the data, is written into the memory. After 16 sectors of data and PI have been stored, an error-correcting code PO is created for the data and PI and added to them. When the data is read from the memory, a PI correcting process is carried out each time a PI series is read out. This makes it possible to restore the original data, even if the data is destroyed (or an error occurs) on the memory.

34 Claims, 10 Drawing Sheets

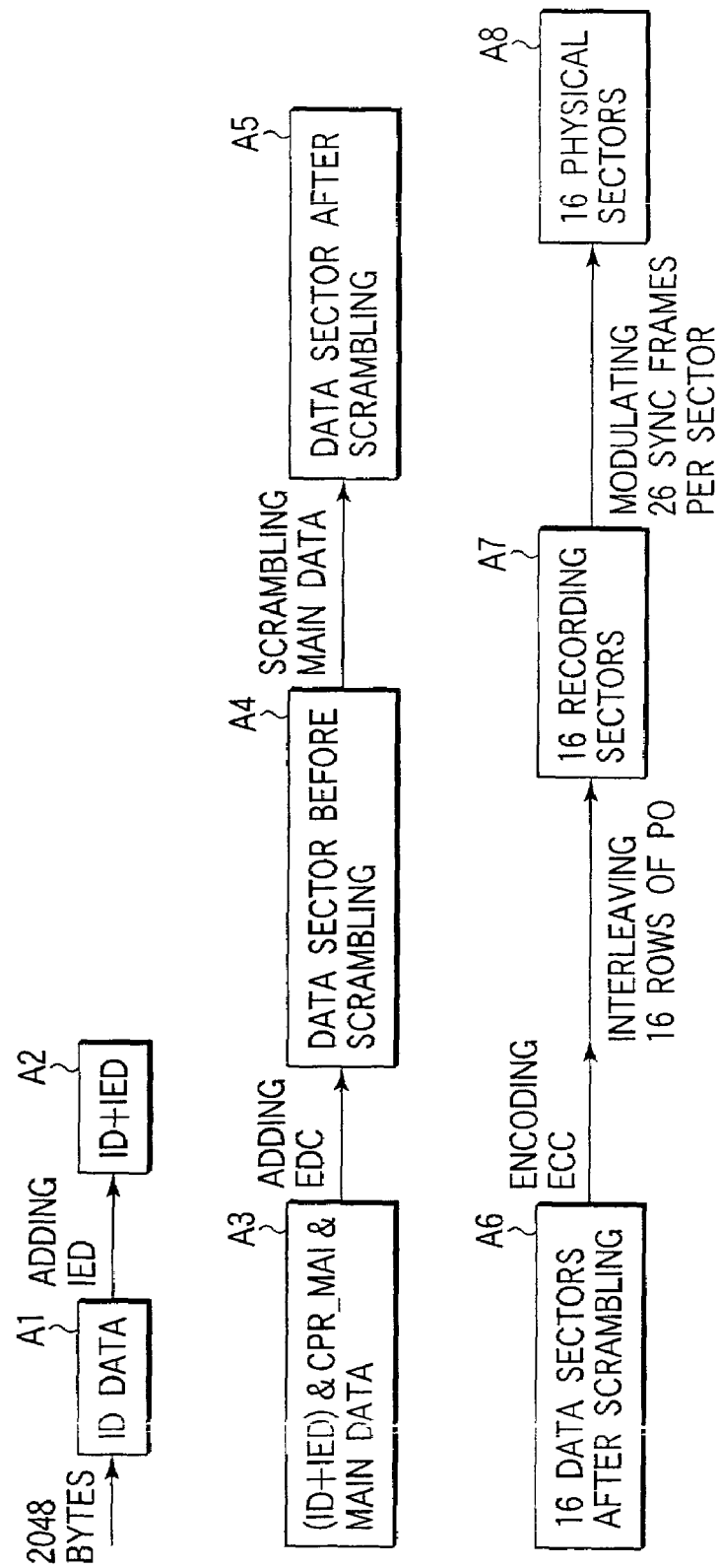
F I G. 1

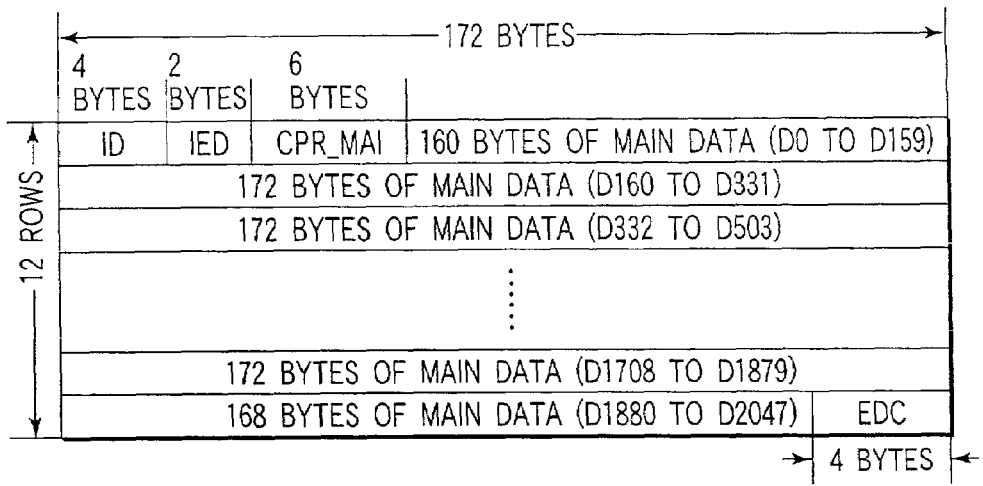
FIG. 2
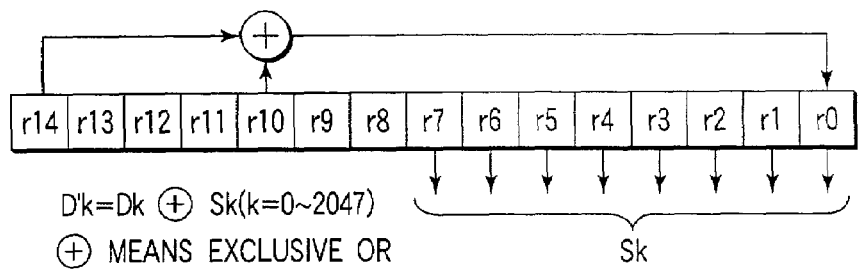
$D'k = Dk \oplus Sk(k=0\sim2047)$
$\oplus$ MEANS EXCLUSIVE OR
FIG. 3
| | 172 BYTES | | | | | 10 BYTES | |
|---|---|---|---|---|---|---|---|
| B0,0 | B0,1 | | B0,170 | B0,171 | B0,172 | | B0,181 |
| B1,0 | B1,1 | | B1,170 | B1,171 | B1,172 | | B1,181 |
| B2,0 | B2,1 | | B2,170 | B2,171 | B2,172 | | B2,181 |
| | | | | | | | |
| B189,0 | B189,1 | | B189,170 | B189,171 | B189,172 | | B189,181 |
| B190,0 | B190,1 | | B190,170 | B190,171 | B190,172 | | B190,181 |
| B191,0 | B191,1 | | B191,170 | B191,171 | B191,172 | | B191,181 |
| B192,0 | B192,1 | | B192,170 | B192,171 | B192,172 | | B192,181 |
| | | | | | | | |
| B207,0 | B207,1 | | B207,170 | B207,171 | B207,172 | | B207,181 |
192 ROWS / 16 ROWS
FIG. 4

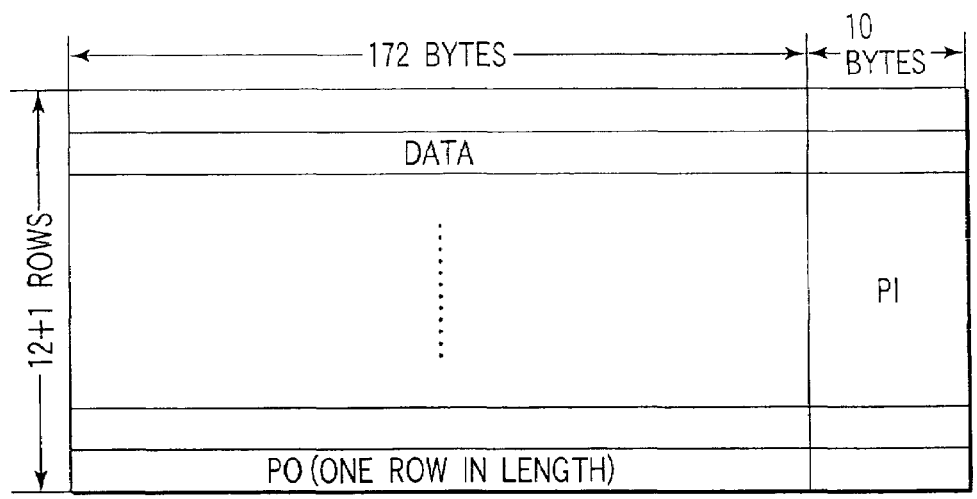
F I G. 5
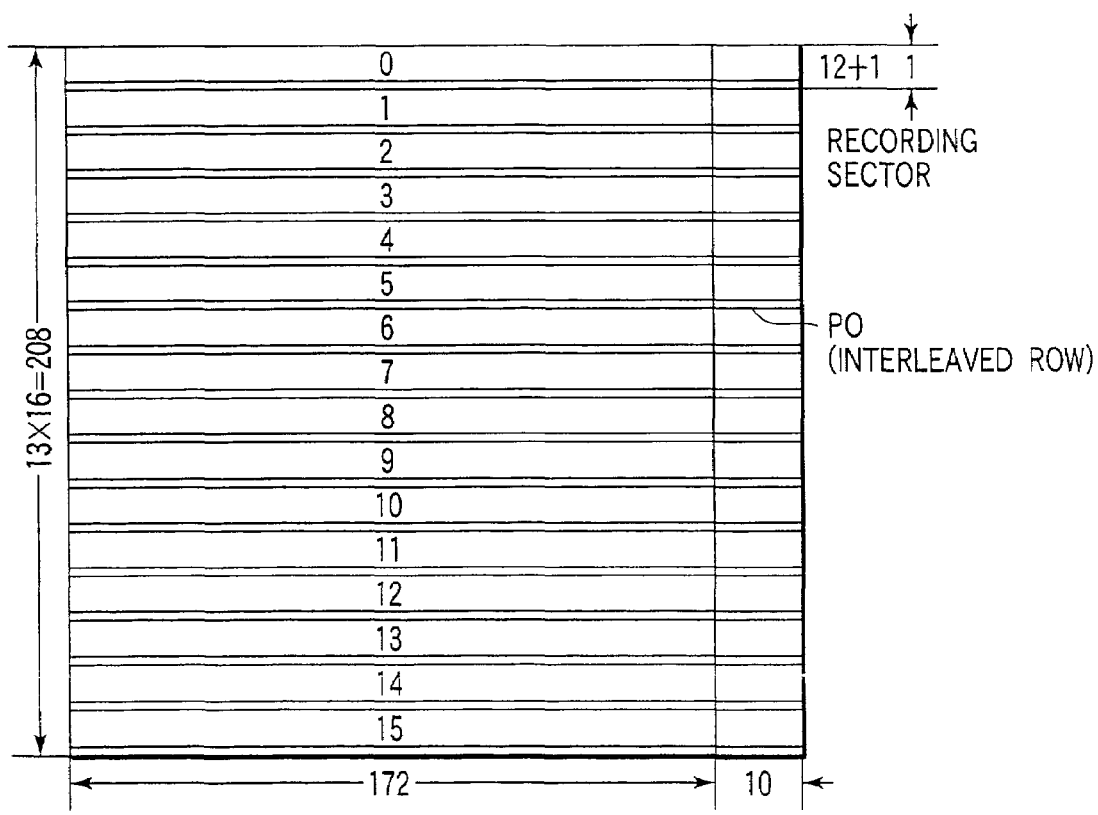
F I G. 6

× MEMORY ERROR
△ ERROR-CORRECTING CODE CREATED ON THE BASIS OF DATA INCLUDING MEMORY ERROR

○ ERROR-CORRECTING CODE CREATED ON THE
  BASIS OF THE ORIGINAL DATA
× MEMORY ERROR
△ ERROR-CORRECTING CODE CREATED ON THE
  BASIS OF DATA INCLUDING MEMORY ERROR

DATA PROCESSING METHOD USING ERROR-CORRECTING CODE AND AN APPARATUS USING THE SAME METHOD

CROSS-REFERENCE TO RELATED APPLICATIONS

This application is based upon and claims the benefit of priority from the prior Japanese Patent Applications No. 2000-377838, filed Dec. 12, 2000; and No. 2000-401172, filed Dec. 28, 2000, the entire contents of both of which are incorporated herein by reference.

BACKGROUND OF THE INVENTION

This invention relates to an error-correcting code creating method effective in recording video data, audio data, or computer data onto a medium (such as an optical disk or a magnetic disk) or in reproducing the data recorded on a medium.

The invention further relates to an error-correcting code creating method effective in transmitting or receiving the video data or the like.

The invention still further relates to a recording device, a reproducing device, and a receiving device which employ the error-correcting code creating method.

The invention is particularly characterized by a method of correcting errors using a buffer memory in carrying out an error correcting process.

When video data, audio data, computer data, or the like is recorded onto, for example, an optical disk or a magnetic disk, error-correcting code is added to the data blocks. In the error-correcting code adding process, a data block is temporarily stored in a memory and the error-correcting codes for the rows and columns of the data block are created.

An error-correcting code added to a row is usually called inner parity and abbreviated as PI. An error-correcting code added to a column is usually called outer parity and abbreviated as PO.

In the error-correcting code adding process, when a data block is temporarily stored in the memory before the generation of an error-correcting code, part of the data on the memory can be destroyed (or an error can occur). The destruction may be ascribed to the data pattern or the mounting state of the memory. In addition, external sudden noise may have an adverse effect.

The error occurred at that time is called a memory error.

In such a case, an error-correcting code for a data block where a memory error has occurred (hereinafter, referred to as an altered data block) is created. The error-correcting code is added to the altered data block and the resulting block is recorded on a recording medium.

When the data is reproduced from the recording medium, the error-correcting circuit uses the error-correcting code to perform an error-correcting process on the altered data block. That is, the altered data block is reproduced correctly. This means that the data block including the memory error has been reproduced correctly. The memory error, however, is unnecessary for the original data.

Consequently, when the memory error has occurred, it is impossible to restore the original data correctly.

BRIEF SUMMARY OF THE INVENTION

It is, accordingly, an object of the present invention to provide a data processing method using error-correcting code capable of restoring the original data correctly even when a date error (memory error) has occurred on memory, a recording-system or reproducing-system unit employing the method, and a transmission-system and a reception-system unit using the method.

The basic idea of the error-correcting code processing method according to the present invention is as follows.

The invention is characterized in that the transmission or recording system creates an error-correcting code PI for each row in a data block with a matrix structure and stores both the error-correcting code PI and the data block in a memory and that, when the error-correcting code PI-added data block is added is read from the memory, the error-correcting process is performed on the rows of the data blocks on the basis of the error-correcting code PI.

Furthermore, the invention is characterized in that, when the matrix-structured data block subjected to the error-correcting process using the error-correcting code PI is read from the memory, the reception or reproducing system performs the error-correcting process again using the error-correcting code PI on the rows of the data block.

Specifically, when storing the data in a memory (first memory), the invention uses a separate second memory (a memory with a structure free from damage to the data, such as SRAM) beforehand to create an error-correcting code PI and writes the resulting data together with the data into the first memory.

Then, after K sectors of data and PI have been stored in the first memory, an error-correcting code PO is created for the data and PI and added to them. When the data is read from the first memory, a PI correcting process is performed, each time the PI series is taken out. This enables the data to be restored to its original state, even if damage to the data on the first memory is caused (or a memory error occurs).

In reproducing the data, the reproduced data is temporarily stored in the memory and the PI and PO error-correcting processes are carried out. When the data on the memory is sent (or transmitted) after the error-correcting processes, the PI correcting process is performed again on the data read from the first memory. This enables the data to be restored to its original state, even if damage to the data on the memory is caused (or a memory error occurs).

Furthermore, an object of the present invention is to provide a data processing device capable of restoring the original data correctly, even when a data error (or memory error) occurs on the memory, and of assuring the reliability of operation by improving the method of using the memory.

Specifically, the present invention is characterized in that the transmission or recording system creates an error-correcting code PI for each row in a data block with a matrix structure and stores both the error-correcting code PI and the data block in a memory and that, when the error-correcting code PI-added data block is read from the memory, an error correcting process is performed on the rows in the data block on the basis of the error-correcting code PI.

Then, when an error impossible to correct is sensed in the course of carrying out the error correcting process using the error-correcting code PI, the memory area in which the relevant row or data block has been stored is changed, thereby avoiding the occurrence of a memory error. Moreover, the area where a memory error has occurred is learned and thereafter is not used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is an explanatory diagram showing the data processing procedure for obtaining a physical sector in a DVD;

FIG. 2 is an explanatory diagram showing the configuration of a data sector in the DVD;

FIG. 3 is an explanatory diagram of a feedback shift register for generating scramble data;

FIG. 4 is an explanatory diagram showing an ECC block;

FIG. 5 is an explanatory diagram showing a recording sector;

FIG. 6 is an explanatory diagram showing an ECC block where an error-correcting code PO is interleaved;

DETAILED DESCRIPTION OF THE INVENTION

Figure 7:
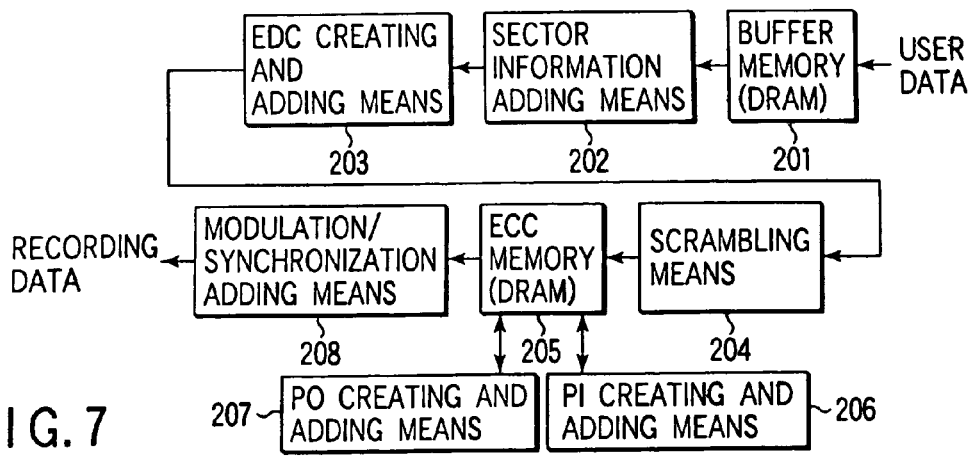
FIG. 7 is a block diagram to help explain an error-correcting code creating method in the recording system in a conventional recording and reproducing unit.

Hereinafter, referring to the accompanying drawings, embodiments of the present invention will be explained.

Using an example of a DVD (digital versatile disk), the configuration of an error-correcting code adding circuit and an error correcting circuit in a data recording and reproducing unit will be explained by reference to FIGS. 1 to 8.

First, referring to FIGS. 1 to 6, the structure of the recorded data on a DVD will be explained.

FIG. 1 shows the sequence of data processing to obtain physical sectors in a DVD. Sectors are called "data sectors," "recording sectors", or "physical sectors" according to the stage of signal processing. As shown in FIG. 2, a data sector includes 2048 bytes of main data, 4 bytes of identification data (ID), 2 bytes of ID error sensing code (IED) (code for sensing an error in ID), 6 bytes of copyright management information (CPR_MAI), and 4 bytes of error sensing signal (EDC) (signal for sensing an error in this data sector). The steps of adding ID, IDE, CPR_MAI, and EDC are step A1 to step A3 in FIG. 1. At step A1, ID is added to the main data. At step A2, IED is further added. In addition, at step A3, CPR_MAI is added.

Next, EDC for the main data is calculated. The EDC is added to the main data. Then, scramble data is added to the main data (containing 2048 bytes) in the data sector (steps A4, A5, A6). Thereafter, 16 data sectors after the scramble are put together. A cross Reed-Solomon error-correcting code is created and added to the 16 data sectors (step A6). The recording sector, an ECC-added sector, is a data sector to which error-correcting code PI and error-correcting code PO are added (step A7). The physical sector is a sector subjected to 8/16 modification whereby a synchronizing code (SYNC code) is added to the head at intervals of 91 bytes in the recording sector (step A8).

Using FIG. 2, the structure of a DVD data sector will be explained.

A data sector contains 2064 bytes including the main data of 2048 bytes long or is composed 172 bytes×12 rows. That is, a data sector includes 2048 byte of main data, 4 bytes of identification data (ID), 2 bytes of ID error sensing code (IED), 6 bytes of copyright management information (CPR_MAI), and 4 bytes of error sensing code (EDC).

FIG. 3 shows a feedback shift register that creates scramble data Sk used to scramble the main data (containing 2048 bytes) at step A4. For example, part of the ID of the data sector is used as the initial value for creating scramble data Sk. The scramble data Sk is used to scramble the main data (2048 bytes) of the data sector. As a result, the main data Dk' after the scrambling is the result of exclusive-ORing Sk (k= 0 to 2047) with Dk.

Using FIG. 4, the structure of an ECC block will be described.

A data block is formed so as to have 172 columns×192 rows, a collection of 16 data sectors each containing 172 bytes×12 rows. Reed-Solomon error-correcting code is created and added to the 172 columns×192 rows. First, a 16-byte error-correcting code PO is created and added to each of the 172 columns. Each column in the PO series contains 192 bytes+16 bytes, or 208 bytes. Next, a 10-byte error-correcting code PI is created and added to each of the 208 rows including the row of the error-correcting code PO. The 182 columns×208 rows to which the error-correcting codes PI and PO have been added forms an ECC block. Even when the order of creating PO and PI is reversed, the identical code pattern is obtained.

One column in the longitudinal direction of the ECC block is called a PO series and one row in the lateral direction a PI series. A PO series contains 192 bytes+16 bytes, or 208 bytes. In one PO series, errors up to 8 bytes long can be corrected. A PI series contains 172 bytes+10 bytes, or 182 bytes. In one PI series, as many as 5 bytes of errors can be corrected.

Next, referring to FIGS. 5 and 6, the structure of a recording sector will be explained.

In the ECC block composed of 208 rows×182 columns, the 16 rows constituting the error-correcting code PO is separated row by row. The separated rows are inserted one by one at intervals of 12 rows of the 192-row data section, resulting in the rearranged form as shown in FIG. 6. This is called the row interleaving of PO. Thus, the ECC block after the row interleaving is composed of 16 sets of 13 rows×182 bytes (=PI-added data (for 12 rows)+PO (for one row)).

As shown in FIG. 5, a recording sector is a sector composed of PI-added data (for 12 rows)+PO (for one row), that is, (13 rows×182 bytes). The ECC block after the row interleaving is composed of 16 recording sectors as shown in FIG. 6.

A physical sector is such that, in a recording sector (2366 bytes) of 13 rows×182 bytes, a synchronizing (SYNC) code is added to the head at intervals of 91 bytes in each row and modulation is effected row by row, starting at row 0. What is obtained by adding the SYNC code to the head of the 91-byte data is called an SYNC frame. Thus, a physical sector is composed of 16 groups×2 SYNC frames.

Figure 8:
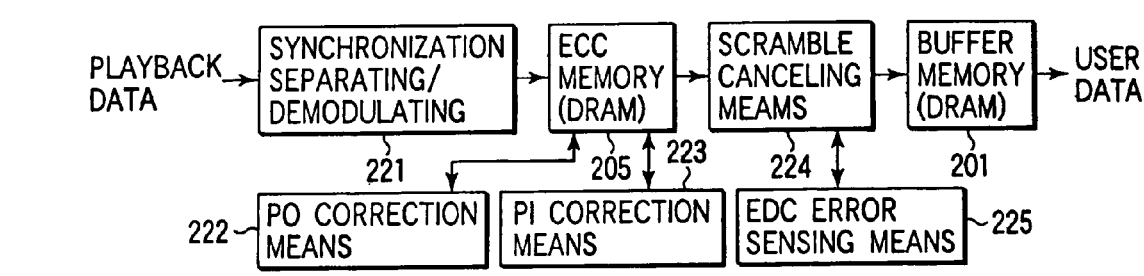
FIG. 8 is a block diagram to help explain an error-correcting code creating method in the reproducing system in a conventional recording and reproducing unit.

Referring to FIGS. 7 and 8, an error-correcting code adding circuit in a data recording unit will be explained.

In FIG. 7, the user data transmitted from the host is stored sequentially in a buffer memory 201. When being read from the buffer memory 201, the stored user data is processed by sector information adding means 202, EDC creating and adding means 203, and scrambling means 204. This process is carried out at intervals of the 2048-byte main data, thereby converting the data into one data sector.

The sector information adding means 202 adds 4 bytes of identification data (ID), 2 bytes of ID error sensing code (IED), and 6 bytes of copyright management information (CPR_MAI) to the main data. The EDC creating and adding means 203 creates and adds 4 bytes of error sensing code (EDC) to a total of 2060 bytes of data, thereby creating a data sector containing 2064 bytes in total. The scrambling means 204 scrambles the main data in the data sector.

The scrambled data sector is stored sequentially in an ECC memory 205. In the ECC memory 205, a data block of 172 columns×192 rows, a collection of 16 data sectors of 172 bytes×12 rows, is formed. PI creating and adding means 206 and PO creating and adding means 207 create and add error correcting codes to the 172 columns×192 rows data block, thereby creating one ECC block.

The ECC block, as explained earlier, is subjected to row interleaving and then transmitted to modulation/synchronization adding means 208. The modulation/synchronization adding means 208 converts the 8-bit input data into 16-bit code words in the inputted row-interleaved ECC block. That is, 8/16 modulation is effected. Then, an SYNC code is added to the head at intervals of 91 bytes of the input data, thereby forming a physical sector. The formed physical sector is transmitted as recording data and recorded on a medium.

Now, the effect of an error-correcting code will be explained.

A data reproducing system including error sensing and correcting means reproduces recording data. When an error occurs in the data in the reproduced physical sector in a reproducing process, this means corrects the error in the error-containing ECC block using an error-correcting code. The error sensing and correcting means can restore the original EEC block without any error in the range of its correcting capability.

Referring to FIG. 8, an error-correcting code creating method on the data reproduction side will be explained. After the playback data read from a recording medium is separated from a synchronizing code by synchronization separating/demodulating means 221, the 8/16 modulation data is demodulated, which extracts the recording sector. Because errors (playback signal errors) occur due to defects in the disk, noise, jitters, crosstalk, or the like in recording or reproducing the recording data, the playback data includes errors.

The read-out recording sectors are stored sequentially in the ECC memory 205, thereby constructing an ECC block with a 182 columns×208 rows composed of 16 recording sectors. PO correction means 222 and PI correction means 223 perform error correction on the 182 columns×192 rows ECC block, thereby correcting errors in the playback signal.

The PI correction means 223 calculates an error pattern sense value syndrome for each row of the ECC block. If an error is sensed, it performs error correction. The syndrome takes the value of 0, when the original data is reproduced without any error. When an error occurs in the course of recording or transmitting a signal, the syndrome takes the value determined by the error location indicating the position where the error has occurred and the error pattern representing the state of the error.

The PO correction means 222 reads 208 bytes of data in the PO series from the memory 205 and performs specific operation on the data. When the syndrome does not become 0 as a result of the operation, the PO correction means 222 performs error correction on the PO series. In the error correcting process, a 16-byte error-correcting code PO enables errors up to 8 bytes long to be corrected in the series. When the data to be corrected is subjected to error correction, thereby restoring the data at the time that the error-correcting code was created, the syndrome takes the value of 0. The above operation is performed on all of the 182 columns of the ECC block.

When errors 8 bytes or more in length are present in one PO series, the PO correction means 222 cannot correct errors. In this case, however, since the PI correction means 223 can correct errors up to 5 bytes long in a PI series, if the length of errors included in one PI series is 5 bytes or less at the time that PO correction was performed on the 182 columns, the errors can be corrected.

Furthermore, the repetition of PO correction and PI correction will possibly correct errors that one PO correction and one PI correction could not correct. When all the syndromes have had the value of 0, the error correction of the ECC block is completed.

The error-corrected ECC block is transmitted to scrambling cancel means 224. The scramble canceling means 224 adds scramble data to (or exclusively ORs scramble data with) the main data of 2048 bytes long in the scrambled data sector to cancel the scrambling of the main data and stores the resulting data in the buffer memory 201.

EDC error sensing means 225 senses an error in the data sector on the basis of the 4-byte error sensing code (EDC) included in the data sector. When an error is sensed, the sector is reproduced again. The data sector stored in the buffer memory 201 is transmitted sequentially to the host.

DRAMs (Dynamic RAMs), low in price and large in capacity, are used as the buffer memories 205, 201. Because of the structure of the DRAM, it can happen that the data on the memory is destroyed (or a memory error occurs), depending on the pattern of the data or the mounting state of the memory. In a state where part of the data on the memory has been destroyed (or a memory error has occurred) and the data block has been altered, when error-correcting codes PI, PO are created and added, the error-correcting codes PI, PO become the correct error-correcting codes for the data altered by the memory error. When the ECC block having the error-correcting codes created for the altered data is recorded as it is and then is reproduced, the altered data is reproduced, even if the error correcting process is carried out after reproduction.

Figure 9:
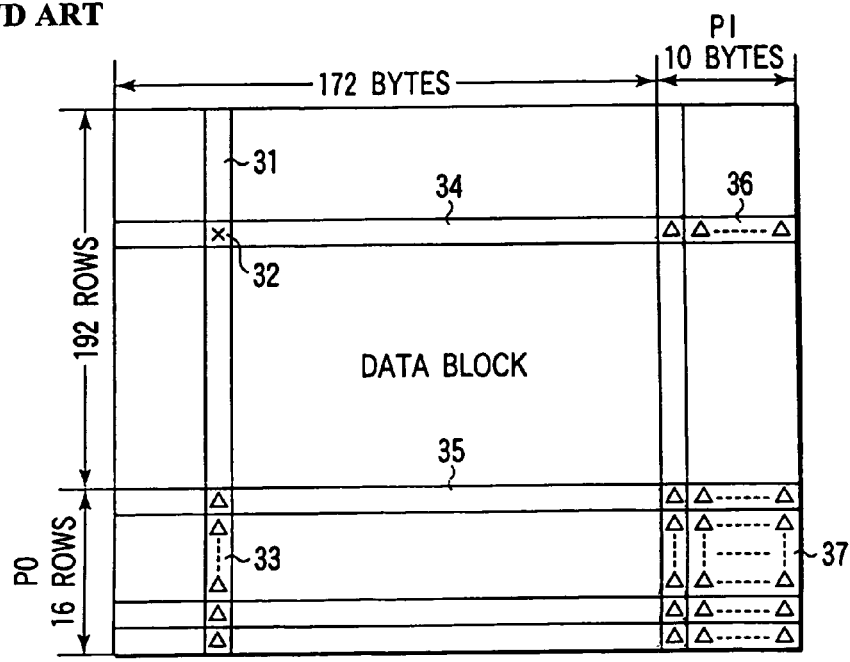
FIG. 9 is a diagram to help explain an error-correcting code when a DRAM memory error occurs in a conventional recording and reproducing unit.

A case where a memory error 32 occurs in part of the data block 36 with 172 bytes×192 rows and the data block is altered will be described by reference to FIG. 9.

First, PO creating and adding means 9 creates an error-correcting code PO for each of the 172 columns and adds the PO to the column. The error-correcting code PO33 (16 bytes) for column 31, however, is created on the basis of the data altered by the memory error 32.

Next, the PI creating and adding circuit 8 creates a 10-byte error-correcting code PI to each of the 208 rows including the error-correcting code PO and adds the PI to the row. The error-correcting code PI 36 (10 bytes) created for row 34 is created on the basis of the data altered by the memory error 32.

Furthermore, an error-correcting code PI 37 created for the error-correcting code PO for 16 rows are created on the basis of the data including the error-correcting code PO 33 created on the basis of the data altered by the memory error 32.

As a result, the proper error-correcting code is added to the data block altered by the memory error 32. At this time, all the error pattern sense value syndromes of the PI series for the 208 rows including error 32 and of the PO series for the 182 columns take the value of 0, with the result that the ECC block is considered to have no error. Actually, however, the original data in the ECC block has been altered by the memory error 32.

Here, consideration will be given to the playback data in recording the ECC block created on the basis of the altered data block onto a recording medium and then reproducing the block from the medium.

The playback data is subjected to an error correcting process using an error-correcting code. Here, an error occurred in the reproduced data is corrected in the range of the correcting capability, thereby restoring the playback data. The memory error included before the recording, however, cannot be corrected. That is, even if an error in the PO series 31 is corrected using the error-correcting code PO 33, the data including the memory error 32 is reproduced and thereafter the error correction is completed properly, which makes it impossible to restore the original user data.

If a memory error occurs in the data on the buffer memory on the reproduction side, there is a possibility that the data including the memory error will be transmitted to the host.

(Points Aimed at by the Present Invention)

As described above, when the data on the memory is destroyed (or when an error occurs), even if an error-correcting code is created on the basis of the data altered by the memory error and the data is read out and subjected to an error correcting process in a reproduce operation to record the data onto a recording medium, the original data is impossible to be restored correctly, although the data altered by the error is restored.

When the data on the memory subjected to error correction is destroyed (or an error occurs), there is a possibility that the erroneous data will be transmitted to the host.

To prevent the data on the memory from being destroyed (or an error from occurring), the memory for storing the data has to be realized by a memory with a structure that prevents the data from being destroyed, such as an S-RAM, or the like. This structure, however, is undesirable in terms of cost.

It is, accordingly, an object of the present invention is to provide a method of and a device for enabling an error-correcting code to be created without losing the original data even if errors occur on memory, and a recording device, a reproducing device, a transmitting device, and a receiving device which use the method and the device.

(Basic Concept of the Present Invention)

An error-correcting code creating system according to the present invention comprises a sector memory (for example, composed of an SRAM), PI creating and adding means for creating and adding PI, a buffer memory for storing PI-added data, PO creating and adding means for creating and adding PO, a row memory (for example, composed of an SRAM), PI correction means for effecting PI correction, and PO correction means for effecting PO correction. The system uses the sector memory to add an error-correcting code PI to the data, stores the PI-added data in the buffer memory, performs PI correction using the row memory before transmitting the PI-added data or recording it onto a recording medium, and thereby enables memory errors to be corrected.

On the reproduction side in the above process, the PI correction is effected again before the data is transmitted to the host, which enables memory errors to be corrected.

Furthermore, an error-correcting code creating system according to the invention comprises the sector memory, PI creating and adding means, buffer memory, PO creating and adding means, PI correction means, and PO correction means. The system uses the sector memory to add an error-correcting code PI to the data to create a data block (PI-added data), stores the PI-added data in the buffer memory, performs PI correction using the buffer memory before transmitting the PI-added data or recording it onto a recording medium, and thereby enables memory errors to be corrected.

In addition, an error-correcting code creating system according to the invention comprises the PI creating and adding means, buffer memory, PO creating and adding means, row memory, PI correction means, and PO correction means. The system creates an error-correcting code PI using the data to be stored in the buffer memory, creates an data block where the error-correcting code PI is added to the data (PI-added data), stores the block in the buffer memory, performs PI correction using the row memory before transmitting or recording the PI-added data from the buffer memory, and thereby enables memory errors to be corrected.

Moreover, an error-correcting code creating system according to the invention comprises the sector memory, PI creating and adding means, PO creating and adding means, PI correction means, and PO correction means. The system adds an error-correcting code PI to the data using the sector memory to create a data block (PI-added data), stores the PI-added data in the buffer memory, transmits or records the PI-added data from the buffer memory, then performs PI correction on the PI-added data on the reproduction side before transmitting the data to the host computer, and thereby enables memory errors to be corrected.

Hereinafter, the characteristic parts of the present invention will be explained using concrete embodiments by reference to the accompanying drawings.

Figure 10:
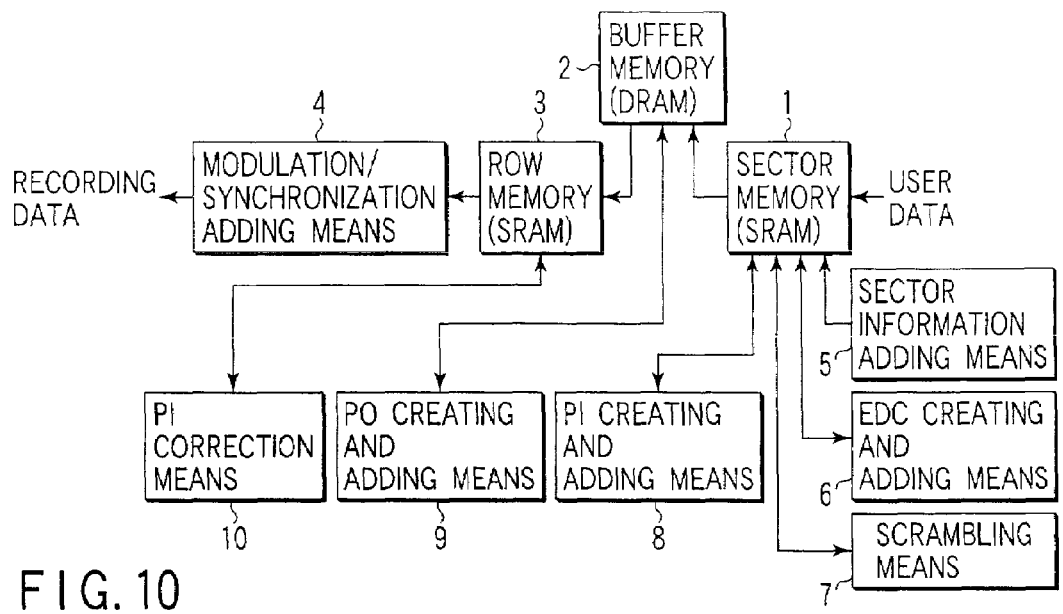
FIG. 10 is a block diagram of a recording system to help explain an embodiment of an error-correcting code creating method according to the present invention.

Referring to FIG. 10, an error-correcting code adding circuit in a data recording device according to a first embodiment of the present invention will be explained. The user data (main data) transmitted from the host is stored sequentially in a sector memory 1. At this time, sector information adding means 5 adds 4 bytes of identification data (ID), 2 bytes of ID error-sensing code (IED), and 6 bytes of copyright management information (CPR_MAI) to the 2048 bytes of main data. EDC creating and adding means 6 creates 4 bytes of error-sensing code for a total of 2060 bytes of data including ID, IED, CPR_MAI and adds the error-sensing code to the 2060 bytes of data. Scrambling means 7 adds scramble data to the main data of 2048 bytes long (or exclusive-ORs the main data with scramble data), thereby creating the scrambled data sector.

PI creating and adding means 8 creates an error-correcting code PI (10 bytes) for each row (172 bytes) in the scrambled data sector (or data block) stored in the sector memory 1 and adds the PI to the row, thereby creating a 182 bytes×12 rows PI-added data sector (data block).

The sector memory 1 has a capacity to store the PI-added data sector (182 bytes×12 rows) and is composed of, for example, an SRAM (Static-RAM). The SRAM has such a structure as seldom allows errors to occur in the stored data, which guarantees that the error-correcting code PI created using the sector memory 1 is the correct code created for the user data without any error.

The PI-added data (or referred to as the data block with 182 bytes×12 rows) from the sector memory 1 is stored sequentially in the buffer memory 2. In the buffer memory 2, 16 data sectors (PI-added data) with 182 bytes×12 rows are gathered together to construct 182 bytes×192 rows of collective PI-added data (or collective data block).

Here, the PO creating and adding means 9 creates an error-correcting code PO (16 bytes) for each column (192 bytes) in the collective data block (182 bytes×192 rows) stored in the buffer memory 2 and adds the PO to the column. As a result, an ECC block to which error-correcting codes PI, PO have been added is constructed for the collective data block stored in the buffer memory 2.

The buffer memory 2 has such a sufficient capacity as holds a plurality of ECC blocks to assure the function of storing the data transmitted from the host computer until it has been recorded onto a recording medium and is composed of, for example, a DRAM. It may happen that the data on the memory is destroyed or memory errors occur, depending on the pattern of the data or the mounting state of the DRAM. A data processing method according to the present invention, however, removes the memory errors as described later.

The ECC block in the buffer memory 2 is read row by row (in units of 182 bytes) and stored in the row memory 3. The PI correction means 10 carries out PI correction using the row memory 3, thereby correcting the memory error, which restores the original data (or the correct ECC block). The row memory 3 is composed of, for example, an SRAM and has a capacity to store one row (182 bytes) of the PI series.

The row data outputted from the row memory 3 is sent sequentially to modulation/synchronization adding means 4, which processes 8/16 modulation and synchronizing code adding and outputs the resulting data as recording data to the recording medium.

Figure 11:
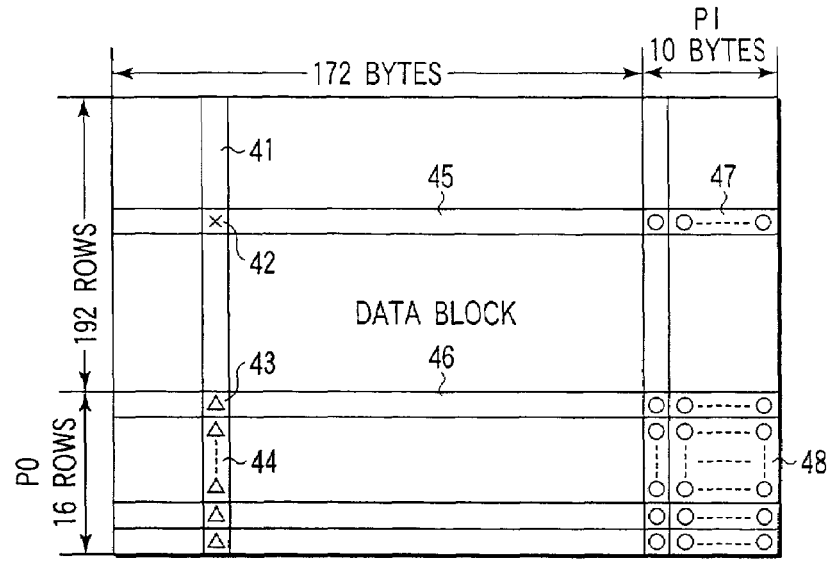
FIG. 11 is an explanatory diagram showing the data structure of an ECC block obtained by the error-correcting code creating method according to the present invention.

FIG. 11 shows a case where errors (such as the aforementioned memory error or errors 42 caused by external noise) have occurred in part of the data in the ECC block outputted from the buffer memory 2.

In the present invention, an error-correcting code PI is created using the data memory 1 before the data is stored in the buffer memory. Thus, all over the 192 rows including row 45, the error-correcting code PI is an error-correcting code created on the basis of the original data. That is, the error-correcting code P1 is an error-correcting code created for the data without error 42.

On the other hand, the PO creating and adding means 9, together with the buffer memory 2, creates an error-correcting code PO on the basis of the data in each column (192 bytes). Thus, the error-correcting code PO 44 (16 bytes) for column 41 is an error-correcting code created on the basis of the data including memory error 42.

A product code is such that, in the part 48 (marked with circle symbols) of an error-correcting code for an error-correcting code, even if code PI is first created and added and then code PO is created and added, or code PO is first created and added and then code PI is created and added, the identical code pattern will be obtained.

Here, the error-correcting code PI is the correct error-correcting code added to the original data before errors have occurred. Thus, the error-correcting code PO created and added to the block of error-correcting code PI is the correct error-correcting code for the original data. Moreover, the error-correcting code PO added to other columns (171) excluding column 41 in the 172 columns shown in FIG. 11 is the correct error-correcting code.

When such an ECC block is read sequentially from the buffer memory 2 and PI correction is performed at the row memory 3, error 42 in the row 45 is subjected easily to PI correction. That is, the row 45 of the correct data is restored. Furthermore, each row in the PO series created for the data including error 42 is also subjected to PI correction, thereby restoring the correct PO series. That is, the row 46 is subjected to PI correction, thereby correcting one byte 43. Similarly, other rows (marked with a triangular symbol) are also subjected to PI correction, creating the correct PO series.

In the above process, PI correction is performed on all the rows in the ECC block at the row memory 3. The PI correction is not limited to this and may be effected on only each row at the position marked with a rectangular symbol to shorten the processing time. This is because the memory error 42 can be corrected easily later, if the PO series at the position of a rectangular symbol in the figure is the correct error-correcting code.

In the above explanation, an ECC block where PO blocks are not distributed row by row in a collective data block has been used. In the actual ECC block, however, an error-correcting code PO is distributed row by row in the collective data block as explained in FIGS. 1 and 6.

Figure 12:
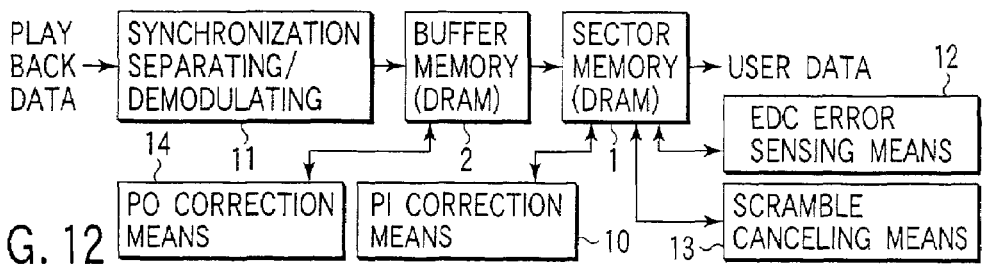
FIG. 12 is a block diagram of a reproducing system to help explain an embodiment of a method of correcting an error in the ECC block obtained by the error-correcting code creating method according to the present invention.

FIG. 12 shows reproduction means for performing an error correcting process on the ECC block obtained by the above process (the process carried out by the circuit of FIG. 10) and reproduced from a recording medium.

The playback data read by the optical head from the recording medium is introduced into synchronization separating/demodulating means 11. The synchronization separating/demodulating means 11 senses synchronization from the playback data and demodulates the data subjected to 8/16 modulation, thereby producing a recording sector. Because errors occur in the data due to flaws in the disk or noise in recording or reproducing the data onto or from the recording medium, errors may be included in the data in the recording sector.

The read-out recording sectors are stored sequentially in the buffer memory 2 and 16 recording sectors are put together, thereby forming an ECC block with 182 columns×208 rows in the buffer memory 2. The PO correction means 14 and PI correction means 10 subject the ECC block with 182 columns×208 rows to error correction.

Here, it is effective to perform the PI correcting process on a PO block before the PO correcting process. This is because, if a memory error occurs in the PO block, PI correction enables the correct error-correcting code PO to be restored.

The error-corrected ECC block is read from the buffer memory 2 row by row (in units of 182 bytes) in the order of data transmission and stored in the sector memory 1. The PI correction means 10 performs PI correction on the 172 byte in each row using the sector memory 1. This is because, when a memory error has occurred in the buffer memory 2 in effecting PO correction, the PI correction is effective in correcting the error.

Next, the scramble canceling means 13 multiplies the scrambled data for the main data (2048 bytes) in the scrambled data sector and the scrambling data, (or processes exclusive-ORs between both data), thereby creating a data sector before scrambling. Then, EDC error sensing means 12 uses a 4-byte error sensing code (EDC) included in the data sector to sense an error in the data sector. If it is sensed that there is no error in the data sector, the data sector will be transmitted to the host.

In the above explanation, when the data is stored from the buffer memory 2 into the sector memory 1, the PI correction means 10 performs PI correction. Alternatively, the PI correction may be performed only when an error has been sensed using the EDC.

Furthermore, in the sense value syndrome (10 bytes) of the error pattern of each row, only part of the syndrome may be calculated to sense an error and, only when it has been judged that an error is present, PI correction be performed. That is, in the error correcting process using error-correcting code PI, only part (R bytes, R<P) of the error pattern sense value (P bytes) obtained from the P-byte error-correcting code PI is calculated and error sensing is done. Only when it has been judge that an error is present, error correction is effected.

Figure 13:
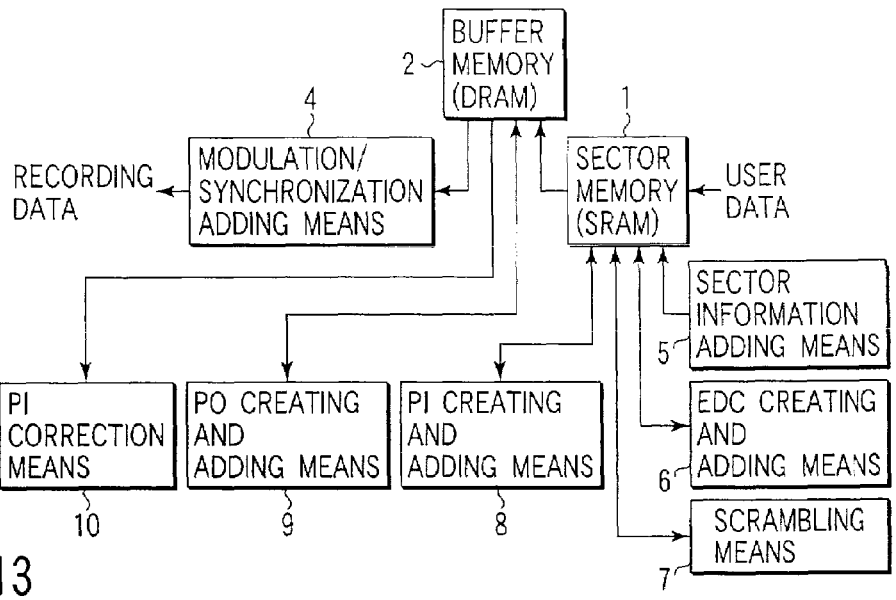
FIG. 13 is a block diagram of a recording system to help explain another embodiment of the error-correcting code creating method according to the present invention.

FIG. 13 shows another embodiment of the present invention.

This embodiment is obtained by eliminating the row memory 3 in the embodiment of FIG. 10. In the embodiment of FIG. 13, the PI correction means 10 performs PI correction using the buffer memory 2. Because the remaining configuration is the same as that of the embodiment of FIG. 10, explanation will be omitted. When a memory error has occurred, the error-correcting code PO created by the PO creating and adding means 9 becomes an error-correcting code created on the basis of the data including a memory error. Performing PI correction on all the rows of the error-correcting code PO enables the error-correcting code PO created on the basis of the data including a memory error to be restored to the error-correcting code PO created on the basis of the original data.

In this embodiment, because the ECC block after PI correction is present in the buffer memory 2, there is a possibility that it will include memory errors. The error-correcting code PO, however, has been restored once to the error-correcting code created on the basis of the original data. Thus, even if the ECC block includes an error, the error will be corrected by PO correction.

Figure 14:
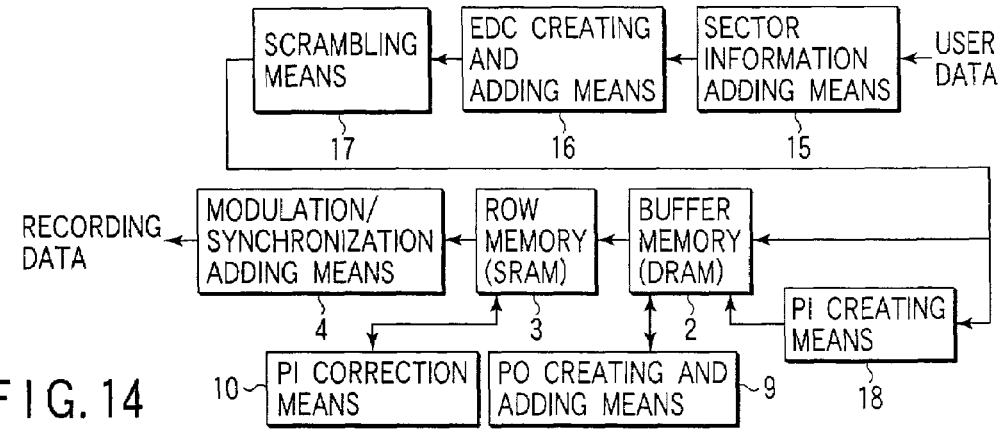
FIG. 14 is a block diagram of a recording system to help explain still another embodiment of the error-correcting code creating method according to the present invention.

FIG. 14 shows still another embodiment of the present invention.

The user data from the host computer is converted by sector information adding means 15 in units of 2048 bytes of the main data into one data sector.

The sector information adding means 15 adds four bytes of identification data (ID), 2 bytes of ID error sensing code (IED), and 6 bytes of copyright management information (CPR_MAI) to the main data. EDC creating and adding means 16 creates 4 bytes of error-correcting code (EDC) for a total of 2060 bytes of data and adds the code to the latter, thereby creating data sectors containing a total of 2064 bytes. Scrambling means 17 scrambles the main data in the data sector.

The scrambled data sector is stored sequentially in the buffer memory 2. In the buffer memory 2, 16 data sectors with 172 bytes×12 rows are gathered together to form a data block with 172 columns×192 rows.

PI creating and adding means 18 receives the data sector from the scrambling means 17, then creates a 10-byte error-correcting code PI sequentially for each row (172 bytes) of data, and supplies the PI to the buffer memory 2. As a result, in the buffer memory 2, a PI-added block with 182 bytes×192 rows is constructed. The error-correcting code PI at this time is an error-correcting code created on the basis of the original data. Because the remaining parts are the same as those in the above-described embodiments, explanation will be omitted.

Figure 15:
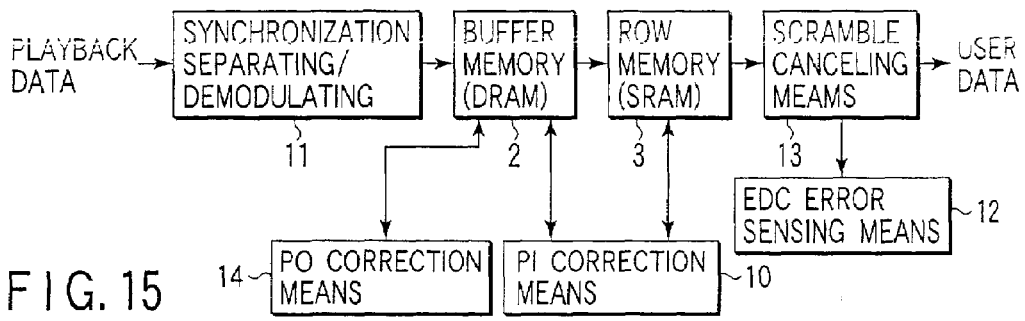
FIG. 15 is a block diagram of a reproducing system to help explain another embodiment of the method of correcting an error in the ECC block obtained by the error-correcting code creating method according to the present invention.

FIG. 15 is an error correcting circuit corresponding to the error-correcting code creating circuit.

This embodiment is almost the same as the embodiment of FIG. 12 except that the output of the buffer memory 2 is given to the row memory 3. The PI correction means 10 performs error correction on a row including at least PO using the buffer memory 2, which turns the error-correcting code PO into correct error-correcting code. Next, PO correction means 14 carries out a PO correcting process. The data after the PO correcting process is supplied to the row memory 3 in the order of transmission. The PI correction means 10 performs PI correction using the row memory 3. This enables the memory error to be corrected at the row memory 3, even if the memory error has occurred into the buffer memory during PO correction.

The scrambling of the data outputted from the row memory 3 is canceled by scramble canceling means, producing a data sector. This data sector is subjected to error sensing by EDC error sensing means 12.

Figure 16:
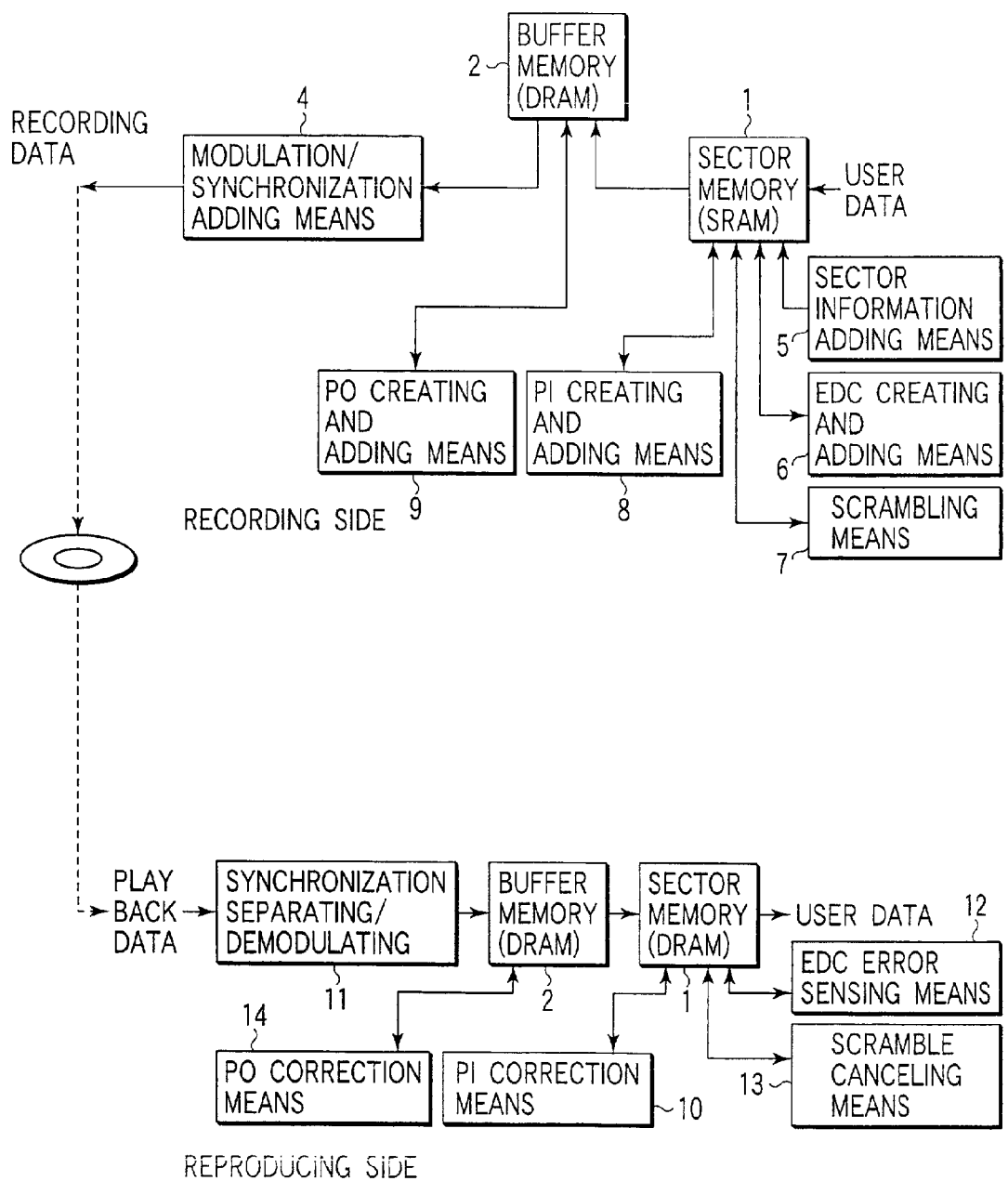
FIG. 16 is a block diagram of a recording and a reproducing system to help explain an embodiment employing an error-correcting code creating method according to the present invention and an error correcting method of correcting errors using error-correcting code.

FIG. 16 shows still another embodiment of the present invention.

This embodiment is obtained by eliminating the PI correction means 10 using the buffer memory 2 in the embodiment of FIG. 13. The remaining part is the same as that of the embodiment of FIG. 13. In this embodiment, when the reproduction system performs error correction on the ECC block constructed in the buffer memory 2, the PI correction means 10 carries out PI correction before PO correction.

As described above, the present invention is effective in a signal transmission/recording and reproducing device capable of carrying out an error-correcting code creating process without losing the original data, even when an error has occurred on the memory. Furthermore, the invention is applied effectively to an inexpensive signal transmission/recording and reproducing device capable of recording the data onto a recording medium without losing the original data, even when the incidence of memory errors is permitted to rise instead of raising the yield by simplifying the inspection of defective memories. The invention may be further applied to various devices of a transmission/reception system in the field of digital communication. They include a radio unit, such as a cellular phone, transmission/reception terminals between computers, and a television transmitter/receiver unit. In the field of recording and reproducing systems, the invention is effective in a DVD unit, a CD unit, and further a memory device or the like that employs a communication function.

As has been described above, with the present invention, it is possible to provide a data processing method using error-correcting codes which is capable of restoring the original data even when a data error (memory error) has occurred, a recording or reproducing system device using the method, and a transmission and a reception system using the method.

The present invention is not limited to the above embodiments. Hereinafter, other embodiments of the present invention will be explained.

Figure 17:
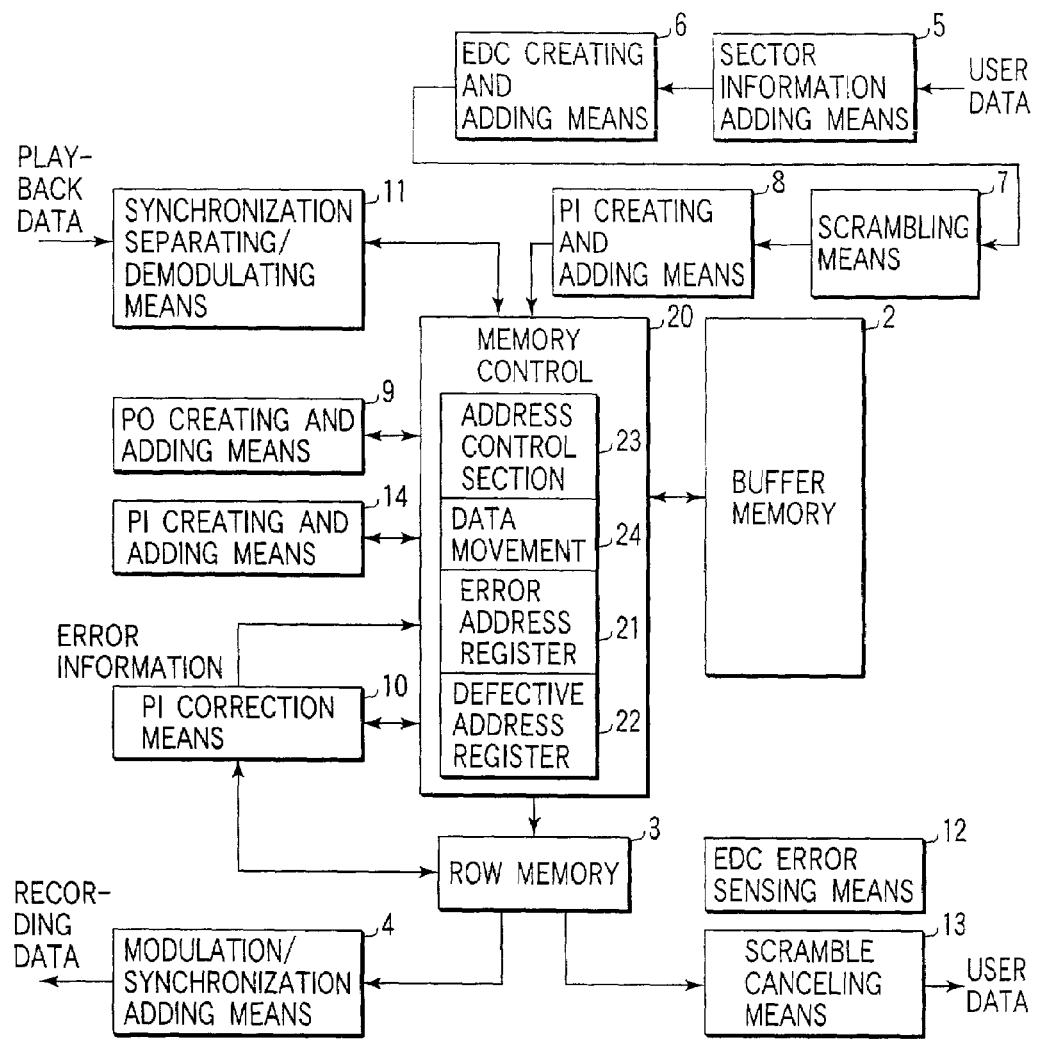
FIG. 17 is a block diagram of a recording system and a reproducing system to help explain still another embodiment of the error-correcting code creating method according to the present invention.

In FIG. 17, the user data from the host computer is converted in units of 2048 bytes by sector information adding means 15 into one data sector.

The sector information adding means 15 adds 4 bytes of identification data (ID), 2 bytes of ID error-sensing code (IED), and 6 bytes of copyright management information (CPR_MAI) to the main data (containing 2048 bytes). EDC creating and adding means 16 creates a 4-byte error-correcting code (EDC) for a total of 2060 bytes of data including ID, IED, and CPR_MAI, thereby creating data sectors containing a total of 2064 bytes. Scrambling means 17 adds scramble data to the main data (2048 bytes) (or exclusive-ORs the main data with scramble data), thereby scrambling the main data.

PI creating and adding means 8 creates an error-correcting code PI (10 bytes) for each row (172 bytes) in the scrambled data sector (or data block) (172 bytes×12 rows=2064 bytes). Then, the created error-correcting code PI is stored sequentially in the buffer memory 2 via memory control means 20. The corresponding 172 bytes×12 rows of data are also stored sequentially in the buffer memory 2 via the memory control means 20, which creates the PI-added data (data block) with 182 bytes×12 rows. Such data processing is continued, thereby constructing 16 error-correcting code PI-added data blocks in the buffer memory 2. That is, in the buffer memory 2, 16 data sectors (PI-added data) with 182 bytes×12 rows are gathered together, constructing a collective PI-added data (or collective data block) with 182 bytes×192 rows.

The error-correcting code PI created in the above process is the correct error-correcting code created on the basis of the original data.

The PO creating and adding means 9 creates an error-correcting code PO (16 bytes) for each column (192 bytes) in the collective data block (182 bytes×192 rows) stored in the buffer memory 2. As a result, an ECC block to which the error-correcting codes PI and PO have been added is constructed for the collective data block stored in the buffer memory 2.

The buffer memory 2 has such a sufficient capacity as holds a plurality of ECC blocks to assure the function of storing the data transmitted from the host computer until it has been recorded onto a recording medium and is composed of, for example, a DRAM. It may happen that the data on the memory is destroyed or memory errors occur, depending on the pattern of the data or the mounting state of the memory. When the error-correcting code PO is created in that state, this error-correcting code PO becomes an error-correcting code created on the basis of the data including memory errors.

The ECC block in the buffer memory 2 is read row by row (in units of 182 bytes) and stored in the row memory 3. The PI correction means 10 carries out PI correction using the row memory 3, thereby correcting the memory errors, which restores the original data (or the correct ECC block). The row memory 3 is composed of, for example, an SRAM (Static-RAM) and has a capacity to store one row (182 bytes) of a PI series.

The row data outputted from the row memory 3 is sent sequentially to modulation/synchronization adding means 4, which processes 8/16 modulation and synchronizing code adding and outputs the resulting data as recording data to the recording medium.

Here, referring to FIG. 11 again, the function of the above embodiment will be described.

FIG. 11 shows a case where an error (such as the aforementioned memory error or an error 42 caused by external noise) has occurred in part of the data in the ECC block outputted from the buffer memory 2.

In the present invention, an error-correcting code PI is created using the data memory 1 before the data is stored in the buffer memory 2. Thus, all over the 192 rows including row 45, the error-correcting code PI is an error-correcting code created on the basis of the original data. That is, the error-correcting code PI of FIG. 11 is an error-correcting code created for the data without error 42.

On the other hand, the PO creating and adding means 9, together with the buffer memory 2, creates an error-correcting code PO on the basis of the data in each column (192 bytes). Thus, the error-correcting code PO 44 (16 bytes) for column 41 is an error-correcting code created on the basis of the data including memory error 42.

A product code is such that, in the part 48 of an error-correcting code for an error-correcting code, even if code PI is first created and added and then code PO is created and added, or code PO is first created and added and then code PI is created and added, the identical code pattern will be obtained.

Here, the error-correcting code PI is the correct error-correcting code added to the original data before the error has occurred. Thus, the error-correcting code PO created and added to the block of error-correcting code PI is the correct error-correcting code created on the basis of the original data. Moreover, the error-correcting code PO added to other columns (171) excluding column 41 in the 172 columns shown in FIG. 11 is the correct error-correcting code.

When such an ECC block is read sequentially from the buffer memory 2 and PI correction is performed at the row memory 3, error 42 in the row 45 is subjected easily to PI correction. That is, the row 45 of the correct data is restored. Furthermore, each row in the PO series created for the data including error 42 is also subjected to PI correction, thereby restoring the correct PO series. That is, the row 46 is subjected to PI correction, thereby correcting one byte 43. Similarly, other rows (marked with a triangular symbol) are also subjected to PI correction, creating the correct PO series.

In the above process, PI correction is performed on all the rows in the ECC block using the row memory 3. The PI correction is not limited to this and may be effected on only each row at the position marked with a rectangular symbol to shorten the processing time. This is because the memory error 42 can be corrected easily later, if the PO series at the position of a rectangular symbol in the figure is the correct error-correcting code.

In the above explanation, an ECC block where PO blocks are not distributed row by row in a collective data block has been used. In the actual ECC block, however, the error-correcting code PO is distributed row by row in the collective data block as explained in FIGS. 1 and 6. That is, the error-correcting code PO is distributed in such a manner that one row of the error-correcting code PO is present for the 12-row collective data block.

The reproduction system of FIG. 17 will be explained later.

The function of memory control means 20 will be described. The memory control means 20 receives a request to store or read the data from the PI creating and adding means 8, synchronization separating/demodulating means 11, PO creating and adding means 9, PO correction means 9, PI correction means 10, and row memory 3. According to the request, the memory control means 20 writes the data into the buffer memory 2 or reads the data from the buffer memory 2. In this case, the memory control means 20 controls the data storage location so as not to use a defective memory area of the buffer memory 2.

It is assumed that the PI correction means 10 requests the memory control means 20 to read the data and one row of data is stored in the row memory 3. Then, the PI correction means 10 is further assumed to perform error correction on the data in the row memory 3. At this time, if an error has been sensed, the PI correction means 10 sends information on the position of the error to the memory control means 20.

The memory control means 20 registers the address at which the data including the error has been stored, in an error address register 21. In the error address register 21, when errors occurred at the same address, the number of times the error occurred is also registered. For example, a memory error occurred twice at the same address, the memory control means 20 judges that the address is a defective address. Then, the memory control means 20 registers the defective address information in a defective-address register 22. The criterion in registering the defective address information in the defective-address register 22 may be three repetitions or more.

The defective-address information registered in the defective-address register 22 is referred to by a data write address and read address control section 23, which prevents the defective address from being used.

Figure 18A:
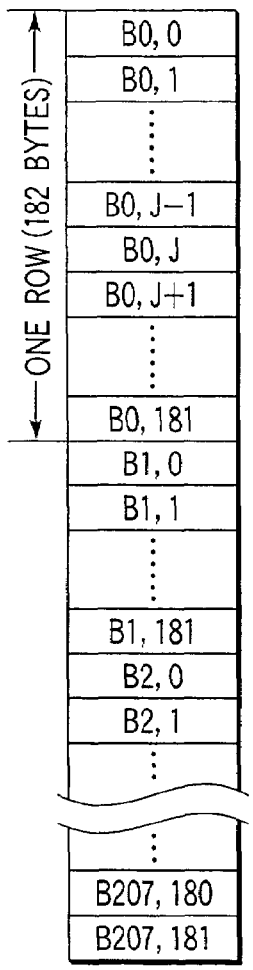
FIGS. 18A and 18B are explanatory diagrams showing examples of a data string of an ECC block including a memory error and a memory map of the buffer memory when the data is processed by an error-correcting code creating method according to the present invention.
Figure 18B:
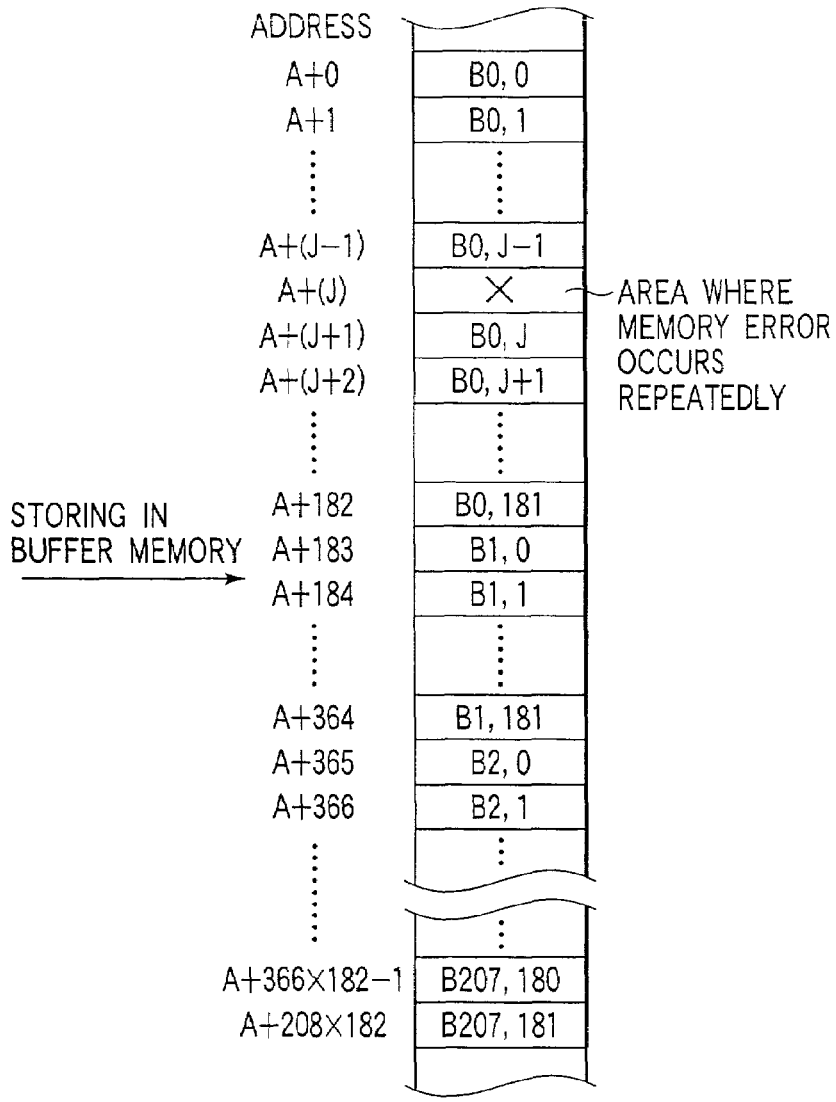

For example, it is assumed that, when data columns (B0, 0) to (B207, 181) in the ECC block of FIG. 18A is stored, starting at address A, address (A+J) has been registered in the defective address register. Then, (B0, J) is stored at address (A+J+1), skipping address (A+J). At this time, (B0, J) may be stored in a previously prepared alternative area. In addition, the defective memory area may be managed not only in bytes but also in rows.

Next, the reprocessing of data when PI correction has failed (or has been impossible) will be explained.

When 6 or more memory errors have occurred in one row, PI correction is impossible. When 6 or more memory errors have occurred in the data in one ECC block, PI correction of PO (16 rows) can fail.

When the fact that the number of errors has exceeded the correctable number of errors is sensed in the PI correcting process, the using memory area is changed and the reprocessing is done. In the reprocessing, the host computer is requested to transmit the data again. Then, the error-correcting code PI-added data is stored in the buffer memory 20 via the memory control means 20. In this case, the using memory area is the area replaced with the error area where the error has been occurred or an empty area different the error area.

When the number of errors has exceeded the correctable number of errors in each row in the area in which the error-correcting code PO has been stored, the reprocessing is effected by the following method.

In effecting the reprocessing, the 192 row×182 bytes collective data block (including error-correcting code PI) with stored in a first storage area in the buffer memory 2 is moved to a second storage area in the buffer memory 2. After each row is subjected to the PI correcting process, the second storage area in the buffer memory 2 is used to perform the PO creating and adding process again. In this case, the reprocessing can be done inside the system without requesting the host computer to transmit the data again.

Figure 19:
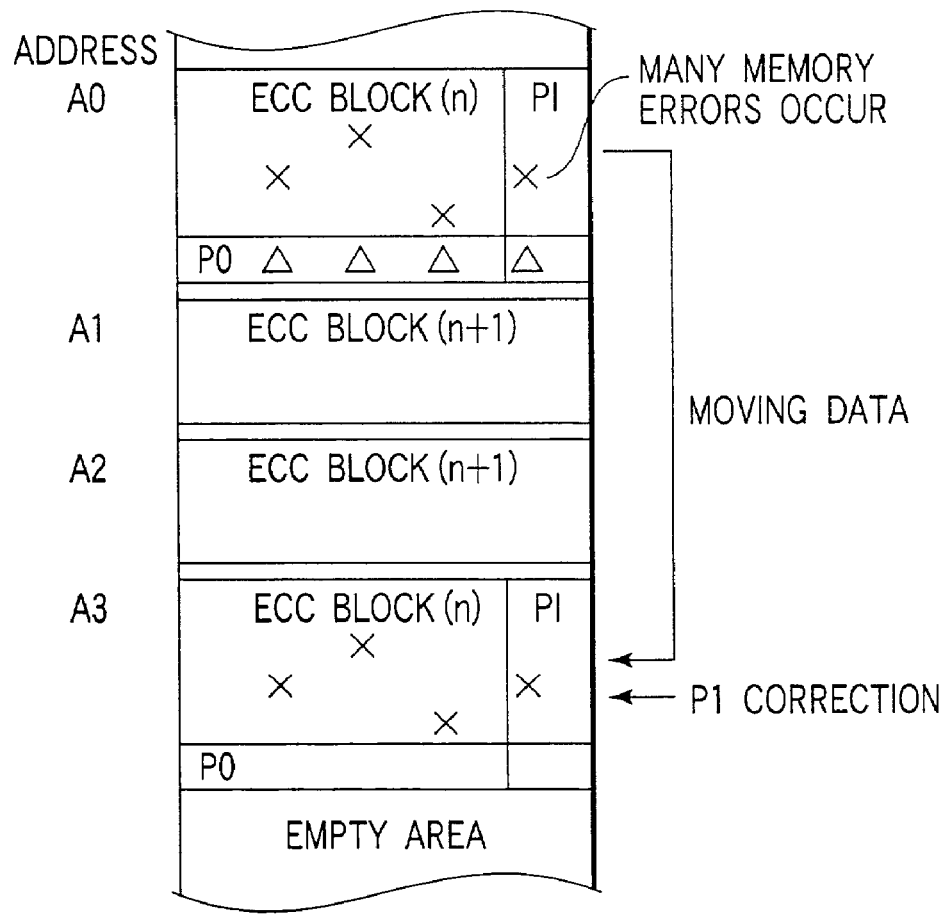
FIG. 19 is an explanatory diagram showing another example of processing an ECC block including a memory error by an error-correcting code creating method according to the present invention.

FIG. 19 is a diagram to help explain the movement of the data on the buffer memory 2.

Data moving means 24 moves the ECC block (n) stored, starting at A0, to an empty area with address A3 at its head. In this case, the moved data includes the memory error included in the area of address A0. Performing the PI correction on each row causes these memory errors to be corrected. Using the data subjected to the PI correcting process, a PO creating and adding process is carried out. If the number of memory errors occurred at that time is 5 or less, the created error-correcting code PO can be corrected by the PI correcting process.

Using FIG. 17, the operation in data reproduction will be described.

The playback data read by the optical head from the recording medium is introduced into synchronization separating/demodulating means 11. The synchronization separating/demodulating means 11 senses and separates synchronization from the playback data and demodulates the data subjected to 8/16 modulation, thereby producing a recording sector. Because errors occur in the data due to flaws in the disk or noise in recording or reproducing the data onto or from the recording medium, errors may be included in the data in the recording sector.

The read-out recording sectors are stored sequentially in the buffer memory 2 via the memory means 20 and 16 recording sectors are put together, thereby forming an ECC block with 182 columns×208 rows in the buffer memory 2. The PO correction means 14 and PI correction means 10 subjects the ECC block with 208 columns×182 rows to error correction.

The error-corrected ECC block is read from the buffer memory 2 row by row (in units of 172 bytes) in the order of data transmission and stored in the row memory 3. The PI correction means 10 performs PI correction on the 172 bytes in each row using the row memory 3. As a result, even if a memory error occurs in the scrambled data sector in the buffer memory 2, the error will be corrected by PI correction.

Next, the scramble canceling means 13 multiplies the scrambled data for the main data (2048 bytes) in the scrambled data sector and the scrambling data, (or exclusive-ORs between both data), thereby creating a data sector before scrambling. Then, EDC error sensing means 12 uses a 4-byte error sensing code (EDC) included in the data sector to sense an error in the data sector. If it is sensed that there is no error in the data sector, the data sector will be transmitted to the host.

As described above, the present invention is effective in a signal transmission/recording and reproducing device capable of carrying out an error-correcting code creating process without losing the original data, even when an error has occurred on the memory. Furthermore, the invention is applied effectively to an inexpensive signal transmission/recording and reproducing device capable of recording the data onto a recording medium without losing the original data, even when the incidence of memory errors is permitted to rise instead of raising the yield by simplifying the inspection of defective memories. The invention may be further applied to various devices of a transmission/reception system in the field of digital communication. They include a radio unit, such as a cellular phone, transmission/reception terminals between computers, and a television transmitter/receiver unit. In the field of recording and reproducing systems, the invention is effective in a DVD unit, a CD unit, and further a memory device or the like that employs a communication function.

As has been described above, with the present invention, it is possible to provide a data processing method using error-correcting codes which is capable of restoring the original data even when a data error (memory error) has occurred on memory, a recording or reproducing system using the method, and a transmission and a reception system using the method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data processing method using error-correcting code, comprising the steps of:

creating a P-byte error-correcting code PI for each row in a data block composed of (M×N) bytes in M rows×N columns and adding the error-correcting code PI to the row by use of a first memory;

gathering together K error-correcting code PI-added data blocks composed of (M×(N+P)) bytes in M rows×(N+P) columns in a second memory to create a collective data block containing (K×(M×(N+P))) bytes;

creating an S-byte error-correcting code PO for each column in said collective data block and adding the error-correcting code PO to the column by use of said second memory to create an error-correcting product code block (ECC block);

performing an error correcting process using the error-correcting code PI added to each row before reading said ECC block from said second memory and transmitting the ECC block; and transmitting the ECC block subjected to said error correcting process or recording the ECC block onto a recording medium sequentially in the order of row.

2. A data processing method using error-correcting code, comprising the steps of:

creating a P-byte error-correcting code PI for each row in a data block composed of (M×N) bytes in M rows×N columns and adding the error-correcting code PI to the row by use of a first memory;

gathering together K error-correcting code PI-added data blocks composed of (M×(N+P)) bytes in M rows×(N+P) columns in a second memory to create a collective data block containing (K×(M×(N+P)));

creating an (S=K×Q)-byte error-correcting code PO for each column in said collective data block and adding the error-correcting code PO to the column by use of said second memory, where the Q is a byte number which configures one column of the PO;

distributing said error-correcting code PO in units of Q bytes to the K error-correcting code PI-added data blocks to cause each block to constitute an error-correcting product code block (ECC block) which is composed of data and error-correcting code and contains a constant value of (M+Q)×(N+P) bytes;

performing an error correcting process using the error-correcting code PI added to each row before reading said ECC block from said second memory and transmitting the ECC block; and transmitting the ECC block subjected to said error correcting process or recording the ECC block onto a recording medium sequentially in the order of row.

3. A data processing method using error-correcting code, comprising the steps of:

when an error-correcting code PI is created for each row in a data block composed of (M×N) bytes in M rows×N columns and added to the row, including a first process of receiving the data in each row (containing N bytes) from a host computer and storing the transmitted N bytes of data sequentially in a second memory and a second process of creating a P-byte error-correcting code for each of said rows on the basis of said transmitted N bytes of data in parallel with the first process and storing the created P-byte error-correcting code PI sequentially into said second memory, and creating an error-correcting code PI-added data block composed of (M×(N+P)) bytes in M rows×(N×P) columns;

gathering together K error-correcting code PI-added data blocks composed of (M×(N+P)) bytes in M rows×(N+P) columns in a second memory to create a collective data block containing (K×(M×(N+P))) bytes;

creating an S-byte error-correcting code PO for each column in said collective data block and adding the error-correcting code PO to the column by use of said second memory to create an error-correcting product code block (ECC block);

performing an error correcting process using the error-correcting code PI added to each row before reading said ECC block from said second memory and transmitting the ECC block; and transmitting the ECC block subjected to said error correcting process or recording the ECC block onto a recording medium sequentially in the order of row.

4. The data processing method according to claim 1, 2, or 3, wherein only the rows of the error-correcting code PO are subjected to the error correcting process, when the error correcting process is performed on said ECC block on the basis of said error-correcting code PI.

5. The data processing method according to claim 1, 2, or 3, wherein each row of said ECC block is read sequentially from said second memory and stored in a third memory, the error correcting process is performed on either each row in the data block stored in said third memory or the row of the error-correcting code PO, when the error correction process is performed on a unit block stored in said third memory on the basis of the error-correcting code PI, and transmitting the unit block subjected to said error correcting process or recording the unit block onto a recording medium sequentially in the order of row.

6. A data processing method using error-correcting code, comprising the steps of:
when an error-correcting code PI-added collective data block containing (K×M×(N+P)) bytes and an error-correcting code PO block containing (S×(N+P)) bytes are transmitted or read from a recording medium and received, the collective data block being such that a P-byte error-correcting code PI is added to each row of a collective data block putting together K data blocks composed of (M×N) bytes in M rows×N columns and containing (K×(M×N)) bytes, and said error-correcting code PO block being such that an S-byte error-correcting code PO is created for each column of said collective data block included error-correcting code PI block,
performing a first error correcting process on error data bytes in said collective data block on the basis of said error-correcting codes PI and PO by use of a second memory; and
performing a row error correcting process on the data subjected to said first error correcting process, on the basis of said error-correcting code PI by use of a first memory.

7. A data processing method using error-correcting code, comprising the steps of:
when an error-correcting product code block (ECC block) is transmitted or read from a recording medium and received, said ECC block being such that a P-byte error-correcting code PI is created for each row in a data block composed of (M×N) bytes in M rows× N columns and the error-correcting code PI is added to the row, that K error-correcting code PI-added data blocks composed of (M×(N+P)) bytes in M rows×(N+P) columns are gathered together to create a collective data block containing (K×(M×(N+P))) bytes, that an (S=K×Q)-byte error-correcting code PO is created for each column in said collective data block and added to the column, where the Q is a byte number which configures one column of the PO, and that said error-correcting code PO is distributed in units of Q bytes to the K error-correcting code PI-added data blocks to cause each data block to be composed of data and error-correcting code, containing a constant value of (M+Q)×(N+P) bytes,
performing an error correcting process on error data bytes in said data block on the basis of said error-correcting codes PI and PO by use of a second memory, and thereafter
performing a row error correcting process on the data subjected to said first error correcting process, on the basis of said error-correcting code PI by use of a first memory.

8. The data processing method according to claim 6 or 7, wherein the error correcting process using said first memory is carried out only when it is judged in reading the data from said second memory from the error detection code (EDC) added to said data block that an error is present in said data block.

9. A data processing method using error-correcting code, comprising the steps of:
creating a P-byte error-correcting code PI for each row in a data block composed of (M×N) bytes in M rows×N columns and adding the error-correcting code PI to the row by use of a first memory to form a data block;
gathering together K units of said error-correcting code PI-added data block composed of (M×(N+P) bytes in M rows×(N+P) columns in a second memory to form a collective data block containing (K×(M×(N+P))) bytes and creating an S-byte error-correcting code PO for each column in said collective data block and adding the error-correcting code PO to the column by use of said second memory to form an error-correcting product code block (ECC block);
carrying out an error correcting process using the error-correcting code PI added to each row of said ECC block before the ECC block is read from said second memory and transmitted;
transmitting the ECC block subjected to said error correcting process or recording the ECC block onto a recording medium sequentially in the order of row;
performing a first error correcting process on error data bytes in said data block on the basis of said error-correcting codes PI and PO by use of said second memory, when the ECC block subjected to said error correcting process is transmitted or read from a recording medium and received; and
performing a row error correcting process on the data subjected to said first error correcting process on the basis of said error-correcting code PI by use of a first memory.

10. A data processing method using error-correcting code, comprising the steps of:
creating a P-byte error-correcting code PI for each row in a data block composed of (M×N) bytes in M rows×N columns and adding the error-correcting code PI to the row by use of a first memory to form a collective data block;
gathering together K units of said error-correcting code PI-added data block composed of (M×(N+P) bytes in M rows×(N+P) columns in a second memory to form a collective data block containing (K×(M×(N+P))) bytes and creating an (S=K×Q)-byte error-correcting code PO for each column in said collective data block and adding the error-correcting code PO to the column by use of said second memory, where the Q is a byte number which configures one column of the PO;
distributing said error-correcting code PO in units of Q bytes to the K error-correcting code PI-added data blocks to construct an error-correcting product code block (ECC block) in such a manner that each data block contains a constant value of (M+Q)×(N+P) bytes composed of a data block and error-correcting code;
carrying out an error correcting process using the error-correcting code PI added to each row in said ECC block before the ECC block is read from said second memory and transmitted;
transmitting the ECC block subjected to said error correcting process or recording the ECC block onto a recording medium sequentially in the order of row;
performing a first error correcting process on error data bytes in said data block on the basis of said error-correcting codes PI and PO by use of said second memory, when the ECC block subjected to said error correcting process is transmitted or read from an recording medium and received; and
performing a row error correcting process on the data subjected to said first error correcting process on the basis of said error-correcting code PI by use of a first memory.

11. The data processing method according to claim 9 or 10, wherein the error correcting process is performed on error data bytes including memory errors in recording on the basis of the error-correcting code PI by use of said second memory, before the first error correcting process is performed on error data bytes in said data block on the basis of said error-correcting codes PI and PO by use of said second memory.

12. The data processing method according to any one of claims 1, 2, 3, 6, 7, 9, and 10, wherein said first memory is Static-RAM.

13. The data processing method according to any one of claims 1, 2, 3, 6, 7, 9, and 10, wherein the error correcting process using said error-correcting code PI is to sense an error by calculating only an R-byte part of the pattern sense value obtained from the P-byte error-correcting code PI, where R<P, and, only when it is judged that there is an error, carry out a correcting process.

14. A data processing device which obtains error-correcting-code-added data using a data processing method according to any one of claims 1, 2, and 3, when the error-correcting-code-added data is transmitted or recorded onto a recording medium.

15. A data processing device which obtains error-corrected output data using a data processing method according to claim 6 or 7, when the error-correcting-code-added data is transmitted or read from a recording medium and received.

16. A data processing device which obtains error-correcting-code-added data or error-corrected output data using a data processing method according to claim 9 or 10, when the error-correcting-code-added data is transmitted or recorded onto a recording medium or when error-correcting-code-added data is transmitted or read from a recording medium and received.

17. A data processing device using error-correcting code, comprising:
  means for creating a P-byte error-correcting code PI for each row in a data block composed of (M×N) bytes in M rows×N columns and adding the error-correcting code PI to the row by use of a first memory;
  means for gathering together K error-correcting code PI-added data blocks composed of (M×(N+P)) bytes in M rows×(N+P) columns in a second memory to create a collective data block containing (K×(M×(N+P))) bytes;
  means for creating an S-byte error-correcting code PO for each column in said collective data block and adding the error-correcting code PO to the column by use of said second memory to create an error-correcting product code block (ECC block);
  means for performing an error correcting process using the error-correcting code PI added to each row before reading said ECC block from said second memory and transmitting the ECC block; and
  means for transmitting the ECC block subjected to said error correcting process sequentially or recording the ECC block onto a recording medium in the order of row.

18. A data processing device using error-correcting code, comprising:
  means for creating a P-byte error-correcting code PI for each row in a data block composed of (M×N) bytes in M rows×N columns and adding the error-correcting code PI to the row by use of a first memory;
  means for gathering together K error-correcting code PI-added data blocks composed of (M×(N+P)) bytes in M rows×(N+P) columns in a second memory to create a collective data block containing (K×(M×(N+P))) bytes;
  means for creating an (S=K×Q)-byte error-correcting code PO for each column in said collective data block and adding the error-correcting code PO to the column by use of said second memory, where the Q is a byte number which configures one column of the PO;
  means for distributing said error-correcting code PO in units of Q bytes to the K error-correcting code PI-added data blocks to cause each data block to constitute an error-correcting product code block (ECC block) which is composed of data and error-correcting code and contains a constant value of (M+Q)×(N+P) bytes;
  means for performing an error correcting process using the error-correcting code PI added to each row before reading said ECC block from said second memory and transmitting the ECC block; and
  means for transmitting the ECC block subjected to said error correcting process or recording the ECC block onto a recording medium sequentially in the order of row.

19. A data processing device using error-correcting code, comprising:
  when an error-correcting code PI is created for each row in a data block composed of (M×N) bytes in M rows×N columns and added to the row,
  means for including a first process of receiving the data in each N-byte from a host computer and storing the transmitted N bytes of data sequentially in a second memory and a second process of creating a P-byte error-correcting code for each of said rows on the basis of said transmitted N bytes of data and storing the created P-byte error-correcting code PI sequentially into said second memory in parallel with the first process, and creating a error-correcting code PI-added data block composed of (M×(N+P)) bytes in M rows× (N×P) columns;
  means for gathering together K error-correcting code PI-added data blocks composed of (M×(N+P)) bytes in M rows×(N+P) columns in a second memory to create a collective data block containing (K×(M×(N+P))) bytes;
  means for creating an S-byte error-correcting code PO for each column in said collective data block and adding the error-correcting code PO to the column by use of said second memory to create an error-correcting product code block (ECC block);
  means for performing an error correcting process using the error-correcting code PI added to each row before reading said ECC block from said second memory and transmitting the ECC block; and
  transmitting the ECC block subjected to said error correcting process or recording the ECC block onto a recording medium sequentially in the order of row.

20. The data processing device according to claim 17, 18, or 19, wherein only the rows of the error-correcting code PO are subjected to the error correcting process, when the error correcting process is performed on said ECC block on the basis of said error-correcting code PI.

21. The data processing device according to claim 17, 18, or 19, further comprising
  means for reading each row of said ECC block sequentially from said second memory and storing the row in a third memory,
  means for performing the error correcting process on either each row in the data block stored in said third memory or the row of the error-correcting code PO, when the error correcting process is performed on a unit block stored in said third memory on the basis of the error-correcting code PI, and means for transmitting the unit block subjected to said error correcting process or recording the unit block onto a recording medium sequentially in the order of row.

22. A data processing device using error-correcting code, comprising:

when an error-correcting code PI-added collective data block containing (K×M×(N+P)) bytes and an error-correcting code PO block containing (S×(N+P)) bytes are transmitted or read from a recording medium and received, the collective data block being such that a P-byte error-correcting code PI is added to each of a collective data block putting together K data blocks composed of (M×N) bytes in M rows×N columns and containing (K×(M×N))) bytes, and said error-correcting code PO block being such that an S-byte error-correcting code PO is created for each column of said collective data block and of said error-correcting code PI-added block, means for performing a first error correcting process on error data bytes in said collective data block on the basis of said error-correcting codes PI and PO by use of a second memory; and means for performing a row error correcting process on the data subjected to said first error correcting process, on the basis of said error-correcting code PI by use of a first memory.

23. A data processing device using error-correcting code, comprising:

when an error-correcting product code block (ECC block) is transmitted or read from a recording medium and received, said ECC block being such that a P-byte error-correcting code PI is created for each row in a data block composed of (M×N) bytes in M rows×N columns and the error-correcting code PI is added to the row, that K error-correcting code PI-added data blocks composed of (M×(N+P)) bytes in M rows×(N+P) columns are gathered together to create a collective data block containing (K×(M×(N+P))) bytes, that an (S=K×Q)-byte error-correcting code PO for each column in said collective data block is created and added to the column, where the Q is a byte number which configures one column of the PO, and that said error-correcting code PO is distributed in units of Q bytes to the K error-correcting code PI-added data blocks to cause each data block to be composed of data and error-correcting code, containing a constant value of (M+Q)×(N+P) bytes, means for performing an error correcting process on error data bytes in said data block on the basis of said error-correcting codes PI and PO by use of a second memory; and means for performing a row error correcting process on the data subjected to said first error correcting process, on the basis of said error-correcting code PI by use of a first memory.

24. The data processing device according to claim 22 or 23, wherein the error correcting process using said first memory is carried out only when it is judged in reading the data from said second memory from the error detection code (EDC) added to said data block that an error is present in said data block.

25. A data processing device using error-correcting code, comprising:

means for creating a P-byte error-correcting code PI for each row in a data block composed of (M×N) bytes in M rows×N columns and adding the error-correcting code PI to the row by use of a first memory to form a data block;

means for gathering together K units of said error-correcting code PI-added data block composed of (M×(N+P) bytes in M rows×(N+P) columns in a second memory to form a collective data block containing (K×(M×(N+P))) bytes and creating an S-byte error-correcting code PO for each column in said collective data block and adding the error-correcting code PO to the column by use of said second memory to form an error-correcting product code block (ECC block);

means for carrying out an error correcting process using the error-correcting code PI added to each row in said ECC block before the ECC block is read from said second memory and transmitted;

means for transmitting the ECC block subjected to said error correcting process or recording the ECC block onto a recording medium sequentially in the order of row;

means for performing a first error correcting process on error data bytes in said data block on the basis of said error-correcting codes PI and PO by use of said second memory, when the ECC block subjected to said error correcting process is transmitted or read from an recording medium and received; and means for performing a row error correcting process on the data subjected to said first error correcting process on the basis of said error-correcting code PI by use of a first memory.

26. A data processing device using error-correcting code, comprising:

means for creating a P-byte error-correcting code PI for each row in a data block composed of (M×N) bytes in M rows×N columns and adding the error-correcting code PI to the row by use of a first memory to form a collective data block;

means for gathering together K units of said error-correcting code PI-added data block composed of (M×(N+P) bytes in M rows×(N+P) columns in a second memory to form a collective data block containing (K×(M×(N+P))) bytes;

means for creating an (S=K×Q)-byte error-correcting code PO for each column in said collective data block and adding the error-correcting code PO to the column by use of said second memory, where the Q is a byte number which configures one column of the PO;

means for distributing said error-correcting code PO in units of Q bytes to the K error-correcting code PI-added data blocks to construct an error-correcting product code block (ECC block) in such a manner that each data block contains a constant value of (M+Q)×(N+P) bytes composed of a data block and error-correcting code;

means for carrying out an error correcting process using the error-correcting code PI added to each row in said ECC block before the ECC block is read from said second memory and transmitted;

means for transmitting the ECC block subjected to said error correcting process or recording the ECC block onto a recording medium sequentially in the order of row;

means for performing a first error correcting process on error data bytes in said data block on the basis of said error-correcting codes PI and PO by use of said second memory, when the ECC block subjected to said error correcting process is transmitted or read from an recording medium and received; and means for performing a row error correcting process on the data subjected to said first error correcting process on the basis of said error-correcting code PI by use of a first memory.

27. The data processing device according to claim 25 or 26, further comprising means for performing the error correcting process on error data bytes including memory errors in recording on the basis of the error-correcting code PI by use of said second memory, before the first error correcting process is performed on error data bytes in said data block on the basis of said error-correcting codes PI and PO by use of said second memory.

28. The data processing device according to any one of claims 17, 18, 19, 22, 23, 25, and 26, wherein said first memory is Static-RAM.

29. The data processing device according to any one of claims 17, 18, 19, 22, 23, 25, and 26, wherein said means for performing the error correcting process using said error-correcting code PI senses an error by calculating only an R-byte part of the pattern sense value obtained from the P-byte error-correcting code, PI, where R<P, and, only when it is judged that there is an error, carries out a correcting process.

30. A data processing device using error-correcting code, comprising:
PI creating and adding means for creating a P-byte error-correcting code PI for each row in a plurality of rows of data, one row containing N bytes, and adding the error-correcting code PI to the row;
a buffer memory for storing the error-correcting code PI-added data in a first area, obtained by said PI creating and adding means, one row containing N+P bytes;
PI error correcting means for correcting errors in each row using the error-correcting code PI added to each row before reading and transmitting said data from said buffer memory; and
memory control means for replacing a memory area of the buffer memory from the first area to a second area, when the PI error correcting means has performed PI-error correction and detected that a correctable number exceeds a predetermined number.

31. A data processing device using error-correcting code, comprising:
PI creating and adding means for creating a P-byte error-correcting code PI for each row in a plurality of rows of data sent from a host computer, one row containing N bytes, and adding the error-correcting code PI to the row;
a buffer memory for storing the error-correcting code PI data obtained by said PI creating and adding means, one row containing N+P bytes;
PO creating and adding means for gathering together K error-correcting code PI-added data blocks, each data block composed of (M×(N+P)) bytes in M rows×(N+P) columns, to form a collective data block containing (K×(×(N+P))) bytes, and creating an S-byte error-correcting code PO for each column in said collective data block and adding the error-correcting code PO to the column to form an error-correcting product code block (ECC block);
PI error correcting means for correcting errors in each row using the error-correcting code PI added to each row before reading said data from said buffer memory and transmitting the data; and
control means for requesting the data before the addition of said error-correcting code PI from said host computer again and making this data the error-correcting code PI-added data in a case where it is sensed that the correctable number of errors has been exceeded when the PI error correcting means has performed error correction, and specifying a second storage area different from a first storage area in which said data was stored last time, when storing the error-correcting code PI-added data in said buffer memory.

32. A data processing device using error-correcting code, comprising:
PI creating and adding means for creating a P-byte error-correcting code PI for each row in a plurality of rows of data, one row containing N bytes, and adding the error-correcting code PI to the row;
a buffer memory for storing the PI error-correcting code-added data obtained by said PI creating and adding means, one row containing N+P bytes;
PO creating and adding means for gathering together K error-correcting code PI-added data blocks, each data block composed of (M×(N+P)) bytes in M rows×(N+P) columns, to form a collective data block containing (K×(M×(N+P))) bytes, and creating an S-byte error-correcting code PO for each column in said collective data block and adding the error-correcting code PO to the column to form an error-correcting product code block (ECC block);
PI error correcting means for correcting errors in each row using the error-correcting code PI added to each row before reading said data from said buffer memory and transmitting the data; and
control means for moving said collective data block containing (K×(M×(N+P))) bytes stored in a first area in said buffer memory to a second area in said buffer memory in a case where it is sensed that the correctable number of errors has been exceeded when the PI error correcting means has corrected errors in the row in which said error-correcting code PO is present, and creating an S-byte error-correcting code PO for each column in said collective data block containing (K×(M×(N+P))) bytes in said second area and adding the error-correcting code PO to the column via said PO creating and adding means.

33. A data processing device using error-correcting code, comprising:
when an error-correcting code PI-added collective data block containing (K×M×(N+P)) bytes and an error-correcting code PO block containing (S×(N+P)) bytes are received from transmission means or a recording medium, the collective data block being such that a P-byte error-correcting code PI is added to each of a collective data block putting together K data blocks composed of (M×N) bytes in M rows×N columns and containing (K×(M×N)) bytes, and said error-correcting code PO block being such that an S-byte error-correcting code PO is created for each column of said collective data block and of said error-correcting code PI-added block,
first means for performing a first error correcting process on error data bytes in said collective data block on the basis of said error-correcting codes PI and PO by use of a buffer memory;
second means for performing a second error correcting process on the rows in the data subjected to said first error correcting process, on the basis of said error-correcting code PI by use of a small memory smaller in capacity than that of said buffer memory; and memory control means for, when the second means performs error correction in the PI series, memorizing information on the memory area in said buffer memory where the data in which an error was sensed is stored and replacing the memory area in said buffer memory where the data in which an error was sensed repeatedly is stored with another memory area.

34. A data processing device using error-correcting code, comprising:

when an error-correcting product code block (ECC block) is received from transmission means or an recording medium, said ECC block being such that a P-byte error-correcting code PI is created for each row in a data block composed of (M×N) bytes in M rows×N columns and the error-correcting code PI is added to the row, that K error-correcting code PI-added data blocks composed of (M×(N+P)) bytes in M rows×(N+P) columns are gathered together to create a collective data block containing (K×(M×(N+P))) bytes, that an (S=K×Q)-byte error-correcting code PO is created for each column in said collective data block and added to the column, and that said error-correcting code PO is distributed in units of Q bytes to the K error-correcting code PI-added data blocks to cause each data block to be composed of data and error-correcting code containing a constant value of (M+Q)×(N+P) bytes, first means for performing a first error correcting process on error data bytes in said data block on the basis of said error-correcting codes PI and PO by use of a buffer memory;

second means for performing a second error correcting process on the rows in the data subjected to said first error correcting process, on the basis of said error-correcting code PI by use of a small memory smaller in capacity than that of said buffer memory; and control means for requesting the data added said error-correcting code PI from said transmission means or recording medium again in a case where it is sensed that the correctable number of errors has been exceeded when the second means has performed PI correction, and specifying a second storage area different from a first storage area in which said data was stored last time, when storing the data in said buffer memory.

* * * * *